United States Patent
Chuang

(10) Patent No.: US 6,807,137 B2
(45) Date of Patent: Oct. 19, 2004

(54) ENCODING METHOD AND APPARATUS THEREFOR, AND OPTICAL-DISK RECORDING METHOD AND APPARATUS THEREFOR

(75) Inventor: Ernest Chuang, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/732,486

(22) Filed: Dec. 11, 2003

(65) Prior Publication Data

US 2004/0170104 A1 Sep. 2, 2004

(30) Foreign Application Priority Data

Dec. 13, 2002 (JP) ........................................ 2002-362930

(51) Int. Cl.[7] .............................. G11B 7/00; H03M 7/00
(52) U.S. Cl. ................................ 369/59.24; 369/59.13; 341/59
(58) Field of Search ............................ 369/59.23, 59.24, 369/59.26, 59.13, 59.14, 59.16, 59.17, 59.19, 124.04; 341/58, 59, 68, 69

(56) References Cited

U.S. PATENT DOCUMENTS

| | | | | |
|---|---|---|---|---|
| 5,365,231 A | * | 11/1994 | Niimura | 341/58 |
| 6,297,753 B1 | * | 10/2001 | Hayami | 341/59 |
| 6,445,313 B2 | * | 9/2002 | Ahn | 341/59 |
| 6,573,848 B2 | * | 6/2003 | Hayami | 341/68 |

* cited by examiner

Primary Examiner—Thang V. Tran
(74) Attorney, Agent, or Firm—Oblon, Spivak, McClelland, Maier & Neustadt, P.C.

(57) ABSTRACT

For encoding a current data word to be encoded, a most suitable redundant signal for the current data word to be encoded is generated by referring to a next data word to be encoded, that is, using a look-ahead decision method. The current data word to be encoded is encoded by using this redundant signal. A low-frequency component of the encoded data is effectively suppressed without decreasing encoding efficiency, by using both a regular substitution code and a stochastic substitution code, and a look-ahead determination algorithm for changing the length of words of a data segment, based on stochastic occurrence of a substitution word.

21 Claims, 20 Drawing Sheets

100
ENCODING METHOD AND APPARATUS THEREFOR, AND OPTICAL-DISK RECORDING METHOD AND APPARATUS THEREFOR

BACKGROUND OF THE INVENTION

1. Field of the Invention

The present invention relates to a channel coding and particularly relates to an improved method and an apparatus for encoding binary data in such a way that the low-frequency component of encoded data is suppressed. The present invention further relates to an optical-disk recording method and an apparatus therefor.

2. Description of the Related Art

For many data-transmission systems and data-recording systems, suppression of low-frequency components in encoded data is important is essential for aiding a decoder in reproducing original data in a noisy environment and avoiding cross coupling with the components of other systems, such as a servo system.

A common strategy used for achieving such a spectral-constraint encoding is to add redundant information to a data word for performing the encoding such that the data word can be equivalently encoded into at least two substitution-information data signals. By selecting substitution information offering a low DC-component, a low-frequency spectrum of the encoded data can be effectively suppressed.

However, the quality of the low-frequency component suppression depends greatly on the amount of the redundant information used for achieving the DC-component suppression and a strategy for selecting a predetermined substitution-encoder mapping method from among a plurality of substitution-encoder mapping methods. Where the amount of the redundant information increases, the quality of the DC-component suppression improves and the encoding efficiency decreases. Therefore, it is important to select an effective strategy for selecting the predetermined substitution-encoder mapping method for designing a system that adds constraints on the DC component of encoded data and that maintains high encoding efficiency at low cost.

This document illustrates a method for improving the selection strategy commonly used for encoders and an apparatus therefor. Accordingly, it becomes possible to improve the quality of DC-component suppression without decreasing the encoding efficiency.

Hitherto, a plurality of methods has been introduced for adding redundant bit data to encoded data so as to suppress the DC component of the encoded data.

For example, in an 8/14 modulation (EFM) encoding method used for a compact-disk (CD) system, an 8-bit data-to-14-bit data translation table maps a sequence of data bytes to code words. The generated translation table satisfies a minimum run-length constraint and ensures that two binary "1" symbols during the encoding process are separated by at least two binary symbols "0" and that a maximum run-length constraint ensures that no binary sequence including ten successive "0" symbols or more occurs in the encoded data.

The minimum run-length constraint depends on the smallest feature size of the physical pit structure of a CD. The maximum run-length constraint is necessary for reliable clock reproduction during decoding process.

A sequence of three margin bits is inserted between each pair of code words. The values of the margin bits can be freely determined as long as the above-described run-length constraints are satisfied.

The freedom of determining the values of the margin bits is limited for the DC-component suppression. After selecting the margin bits, the run-length-encoded data including the margin bits are NRZI (non-return to zero inverse) modulated, so that each "1" symbol in the encoded data bit sequence is mapped to a bit transition in the modulation bit sequence.

For determining the values of the margin bits so that DC components are reduced, a running digital sum (RDS) value is determined to be the difference between the number of binary "1" symbols and the number of binary "0" symbols over the modulation bit sequence. The data to be encoded are presented to the encoder as 8-bit words in a sequential order. For each data word to be encoded, the margin bits are selected such that the RDS value approaches zero as much as possible and the number of "1" symbols and the number of "0" symbols in the modulation bit sequence are balanced.

Another example for using redundant information for reducing a DC component is an EFM$^+$ encoding method used for a digital versatile disk (DVD) system. The EFM$^+$ encoding method is an improved modification of the EFM encoding method. In the EFM$^+$ encoding method, a data word of 8 bits is mapped to a code by using an 8 bit-to-16 bit state-dependent translation table.

Unlike the EFM encoding method, according to the EFM$^+$ encoding method, there are no margin bits used for the DC-component control and code word concatenation. However, each data word can be encoded in another way by using a substitution table.

However, the selection strategy of the EFM$^+$ encoding method for the DC-component suppression is essentially the same as that used in the EFM encoding method for each valid encoding substitution information, wherein an RDS value closest to zero is selected.

A third example of the DC-free encoding method is an 8/14 modulation parity preserving (EFMPP) encoding method proposed by Philips Corporation. According to this EFMPP encoding method, a data word of 8 bits is mapped to a code by using an 8/15 mapping table, as in the case of the EFM$^+$ encoding. Since the EFMPP encoding method is unique and not used in general, there is nothing to show a substitution code for a data word. For achieving the DC-component control, the data bit sequence is therefore interleaved with a DC control bit sequence before the encoding is actually performed. Accordingly, the redundancy required for suppressing the DC component is provided.

Both the EFM encoding method and the EFM$^+$ encoding method use the same strategy, that is to say, the RDS value is calculated for calculating the value of a DC-control bit. Further, the RDS value closest to zero is selected.

As has been described above, the inventors of the present invention conclude that there are different techniques for adding redundant information to encoded data, such as:

(1) Adding redundant information to a modulation bit sequence by using margin bits or substitution-encoder mapping, and (2) Adding redundant information by inserting control bits into a bit data sequence before encoding.

However, in a particular encoding method such as the EFM encoding method, a DC-component suppression algorithm and an encoding translation method are tightly and architecturally integrated, and the DC-component suppression method and the encoding translation are conceptually separated from each other.

Therefore, the present invention does not depend on a particular encoding method such as the EFM encoding method used for the CD system or the EFM+ encoding method used for the DVD system. Rather, the present invention allows the encoder to select data for code mapping so as to achieve the DC-component suppression. By implementing a novel selection strategy for selecting substitution data for the code mapping, the low-frequency component of encoded data is suppressed.

In the above-described encoding methods, both the transition from the EFM encoding method to the EFM+ encoding method and the transition from the EFM+ encoding method to the EFMPP encoding method achieve high encoding efficiency. However, this high encoding efficiency is obtained at the sacrifice of the quality of the DC-component suppression. Therefore, there is a need for a better DC selection strategy that does not decrease the encoding efficiency.

Another example DC-free encoding method is the EFM combi-code (EFMCC) encoding method proposed by Philips Corporation. In the EFMCC method encoding, a data word of 8 bits is mapped to a code mostly by using an 8-to-15 main-code mapping method similar to that of the EFM+ encoding method. However, at predetermined word intervals, 8-to-17 substitution-code mapping is performed, which offers a choice between two code words. A subsequent state in a finite state machine (FSM) of one of these two code words is the same as that of the other. However, the parity of one of these two code words is opposite to that of the other, so that DC-component control is achieved. In this manner, the redundancy required for suppressing the DC component is provided. As in the case of the EFM+ encoding method, the same strategy for determining a suitable method for selecting a substitution code can be used through calculating the RDS value for each case and selecting a method that minimizes the RDS value. The EFMCC encoding can also be slightly modified for allowing the use of additional stochastic substitution information can be used, where a predetermined digital pattern appears in an encoded code sequence.

Recently, other determination algorithms have been introduced. For example, code-word selection is performed for minimizing the variance of the RDS, rather than the magnitude thereof. In another example, look-ahead encoding method is used. These algorithms have been introduced considering not only the effect of selecting substitution information for immediate surrounding code-words, but also a cumulative effect obtained by determining a predetermined number of future possible determination methods. However, the look-ahead algorithm was originally designed for the case where determination points occur at predetermined fixed intervals, as in the case of the insertion points of the substitution-code words used in the EFMCC encoding method. As a result, subsequent addition of possible stochastic substitution codes in the EFMCC encoding suggested an algorithm by which the look-ahead encoding was performed with only regular substitution-codes as determination points, with the additional stochastic substitutions being performed based only on local (partial) benefits on each branch extension as the look-ahead decision-tree was propagated. Because some of the stochastic substitutions can depend on a choice of a substitution code in the previous word, different branch extensions could receive different substitution patterns. The determination whether or not a particular substitution code should be used was based on its effect on the RDS value (or the RDS variance) of the current word and also the next word. While this technique offers some improvement, it does not take advantage of the stochastic substitution in an optimal manner, because it considers only their local benefits, rather than their effect on the look-ahead tree as a whole.

SUMMARY OF THE INVENTION

An object of the present invention is to provide an encoding method for achieving good DC suppression without decreasing the encoding efficiency and an apparatus therefor.

Another object of the present invention is to provide an optical-disk recording method using the above-described encoding method and the apparatus and an optical-disk recording apparatus.

According to a first aspect of the present invention, there is provided a method for encoding binary data. This methods includes the steps of performing encoder mapping for converting at least one data word having N data bit(s) into at least one binary modulation word having M data bit(s), wherein redundant information is provided so that a predetermined data word can be translated into a plurality of modulation words, and selecting a predetermined modulation word from among the plurality of modulation words obtained through the encoder mapping step, according to a look-ahead determination criterion method.

The look-ahead determination criterion method includes the steps of recording a current data word to be modulated and a predetermined number of future data words in either an original form or in a pre-encoded form, making a path search for evaluating a running digital sum (RDS) for a combinational tree whose space is expanded by a multiplier of the modulation words generated by performing the encoder mapping for the recorded current and future data words, and making a determination to select an encoding mapping method suitable for the current data word to be encoded by selecting a path nearest to bounds of the RDS of the path search.

A low-frequency component of a resulting binary modulation sequence is suppressed so that the value of a first-order spectrum becomes null at a frequency of 0 Hz.

According to a second aspect of the present invention, there is provided an encoding apparatus for encoding binary data. This encoding apparatus comprises an encoder mapping device for converting at least one data word having N data bit(s) into at least one binary modulation word having M data bit(s) and providing redundant information so as to translate a predetermined data word into a plurality of modulation words. This encoding apparatus further comprises a look-ahead determination criterion generator and a selector for selecting a predetermined modulation word from among the plurality of modulation words obtained through the encoder mapping device according to a criterion generated by the look-ahead determination criterion generator.

The look-ahead determination criterion generator includes a memory for,recording a current data word to be modulated and a predetermined number of future data words in either an original form or in a pre-encoded form. The look-ahead determination criterion generator further includes a path searcher for evaluating a running digital sum (RDS) for a combinational tree whose space is expanded by the plurality of modulation words generated through the encoder mapping performed for the recorded current data word and future data words. The look-ahead determination criterion generator further includes a determination device for selecting an encoding mapping method suitable for the current data word to be encoded by determining a path nearest to bounds of the RDS of the path search.

A low-frequency component of a resulting binary modulation sequence is suppressed so that the value of a first-order spectrum becomes null at a frequency of 0 Hz.

By using the above-described encoding method and the encoding apparatus, a sequence including binary source data is processed so that a sequence including binary DC-free modulation data is generated.

According to a third aspect of the present invention, there is provided an optical-disk recording method for recording an information signal onto an optical-disk recording medium by performing on/off modulation for continual laser light in a predetermined cycle based on a resulting encoded signal obtained through a predetermined encoding method. This encoding method includes the steps of performing encoder mapping for converting at least one data word having N data bit(s) into at least one binary modulation word having M data bit(s), wherein redundant information is provided so that a predetermined data word can be translated into a plurality of modulation words, and selecting a predetermined modulation word from among the plurality of modulation words obtained through the encoder mapping step according to a look-ahead determination criterion method.

This look-ahead determination criterion method includes the steps of recording a current data word to be modulated and a predetermined number of future data words in either an original form or in a pre-encoded form, making a path search for evaluating a running digital sum (RDS) for a combinational tree whose space is expanded by the plurality of modulation words generated by performing the encoder mapping for the recorded current and future data words, and making a determination to select an encoding mapping method suitable for the current data word to be encoded by selecting a path nearest to bounds of the RDS of the path search.

The step of making the determination includes the step of selecting an encoder mapping method suitable for the current data word to be encoded by determining a path that is nearest to the bounds of the RDS and that is nearest to the bounds of a running sum of the RDS.

As a result, a low-frequency component of a resulting binary modulation sequence is effectively suppressed so that the value of a second-order spectrum becomes null at the frequency of 0 Hz.

According to a fourth aspect of the present invention, there is provided an optical-disk recording apparatus comprising a laser-light source for emitting continual laser light, a modulator for modulating the continual laser light from the laser-light source and irradiating an optical-disk recording medium with the modulated laser light and an encoding device for encoding an information signal to be recorded onto the optical-disk recording medium into an on-off modulation signal and outputting the encoded on-off modulation signal to the modulator.

This encoding device includes an encoder mapping device for converting at least one data word having N data bit(s) into at least one binary modulation word having M data bit(s) and providing redundant information so as to translate a predetermined data word into a plurality of modulation words. This encoder further includes a look-ahead determination criterion generator, and a selector for selecting a predetermined modulation word from among the plurality of modulation words obtained through the encoder mapping device according to a criterion generated by the look-ahead determination criterion generator.

The look-ahead determination criterion generator includes a memory for recording a current data word to be modulated and a predetermined number of future data words in either an original form or in a pre-encoded form. The look-ahead determination criterion generator further includes a path searcher for evaluating a running digital sum (RDS) for a combinational tree whose space is expanded by the plurality of modulation words generated through the encoder mapping performed for the recorded current data word and future data words. The look-ahead determination criterion generator further includes a determination device for selecting an encoding mapping method suitable for the current data word to be encoded by determining a path nearest to bounds of the RDS of the path search.

The determination device has a selector for selecting an encoder mapping method suitable for the current data word to be encoded by determining a path that is nearest to bounds of the RDS and that is nearest to bounds of a running sum of the RDS.

A low-frequency component of a resulting binary modulation sequence is effectively suppressed so that the value of a second-order spectrum becomes null at a frequency of 0 Hz.

According to a fifth aspect of the present invention, there is provided a method for encoding binary data. This method includes the steps of performing encoder mapping for converting at least one data word having N data bit(s) into at least one binary modulation word having M data bit(s), wherein redundant information is provided so that a predetermined data word can be translated into a plurality of modulation words by using a regular substitution code and a stochastic substitution code, detecting a position of a word for which the regular substitution code and the stochastic substitution code are used, and selecting a predetermined modulation word from among the plurality of modulation words obtained through the encoder mapping step, according to a look-ahead determination criterion method.

The selection step includes the steps of storing a current data segment to be encoded with a variable length and a future data segment with a variable length in either an original form or in a pre-encoded form, and evaluating a determination criterion for each path search in a combinational tree whose space is expanded by the plurality of modulation words. The modulation words are generated by performing the encoder mapping for the current data segment and the future data segment that are stored in the memory. The selection step further includes the step of making a determination to select an encoding mapping method suitable for the current data segment to be encoded by the determining a path with a best value the determination criterion for the path search. As a result, a low-frequency component of a resulting binary modulation sequence is effectively suppressed.

According to a sixth aspect of the present invention, there is provided an encoding apparatus for encoding binary data. This encoding apparatus comprises an encoding that converts at least one data word having N data bits(s) into at least one binary modulation word having M data bit(s) and that provides redundant information for translating a predetermined data word into a plurality of modulation words by using a regular substitution code and a stochastic substitution code. This encoding appataratus further comprises a detector for detecting a position of a word for which the regular substitution code and the stochastic substitution code are used, and a selector for selecting a predetermined modulation word from among the plurality of modulation words, which is obtained by the encoder, according to a look-ahead determination criterion.

This selector includes a memory for storing a current data word to be with a variable length and a future data segment with a variable length in either an original form or in a pre-encoded form and an evaluation device for evaluting a determination criterion for each path search in a combinational tree whose space is expanded by the plurality of modulation words. The modulation words are generated by performing the encoder mapping for the current data segment and the future data segment that are stored in the memory. This selector further includes a determination apparatus for making a determination to select an encoding mapping method suitable for the current data segment to be encoded by determining a path with a best value of the determination criterion for the path search.

Accordingly, a low-frequency component of a resulting binary modulation sequence is effectively suppressed.

According to a seventh aspect of the present invention, there is provided an optical-disk recording apparatus. This optical-disk recording apparatus comprises a laser-light source for emitting continual laser light and a modulator for modulating the continual laser light from the laser-light source and irradiating an optical-disk recording medium with the modulated laser light. This optical-disk recording apparatus further comprises an encoding device for encoding an information signal to be recorded onto the optical-disk recording medium into an on-off modulation signal and outputting the encoded on-off modulation signal to the modulator.

This encoding device includes an encoder for converting at least one data word having N data bit(s) into at least one binary modulation word having M data bit(s) and providing redundant information so as to translate a predetermined data word into a plurality of modulation words by using a regular substitution code and a stochastic substitution code. This encoding device further includes a detector for detecting a position of a word for which the regular substitution code and the stochastic substitution code are used and a selector for selecting a predetermined modulation word from among the plurality of modulation words, which is obtained by the encoder, according to a look-ahead determination criterion.

This selector includes a memory for storing a current data segment to be encoded with a variable length and a future data segment with a variable length in either an original form or in a pre-encoded form and an evaluation device for evaluating a determination criterion for each path search in a combinational tree whose space is expanded by the plurality of modulation words. This selector further includes the modulation words being generated by performing the encoder mapping for the current data segment and the future data segment that are stored in the memory, and a determination apparatus for making a determination to select an encoding mapping method suitable for the current data segment to be encoded by determining a path with a best value of the determination criterion for the path search.

Accordingly, a low-frequency component of a resulting binary modulation sequence is effectively suppressed.

The present invention has the following features:

(1) The encoding method and the apparatus therefor according to the present invention comprise at least one functional step and at least one apparatus, that is, an encoding mapping step and an apparatus for mapping a source data sequence to a modulation data sequence and selecting an effective method of valid source-to-modulation data mapping from among a plurality of valid source-to-modulation data mapping methods, and (2) A look-ahead DC controlling method and an apparatus therefor according to the present invention for selecting a suitable method from among a plurality of substitution source-to-modulation data mapping methods so as to suppress the DC component of final modulation data.

The present invention is achieved by improving the above-described related art. The strategies of the present invention for selecting a suitable method for controlling a DC component and an apparatus therefor achieve better DC-component suppression.

The selection strategies of the present invention are shown as below:

(a) A look-ahead DC control method and an apparatus therefor that select a substitution encoding method by incorporating a data block to be encoded and a fixed number of future data words into determination, and (b) A determination criterion on the basis of the RDS (or variance) or the modification thereof and the summation of the RDS (or variance) or a bound on the modification thereof.

The present invention does not modify the encoder mapping method, but improves the DC-selection strategy of the encoding A, which is modified by the present invention, resulting in an improved encoding method $A^+$. In this case, there is no need to modify the decoder side for decoding encoded data encoded by using the improved encoding method $A^+$. Consequently, good DC-component suppression is achieved. Therefore, it is possible to apply the present invention to a currently-used recording technology such as a CD system. In this case, the present invention increases the quality and reliability of a data storage disk by reducing the DC component of encoded data and eliminates the need of modifying the player of a user.

BRIEF DESCRIPTION OF THE DRAWINGS

FIG. 6 is a circuit diagram of an FSM encoder shown in. FIG. 4;

DESCRIPTION OF THE PREFERRED EMBODIMENTS

The objects and characteristics of the present invention will now be described with reference to the attached drawings.

First Embodiment

A first embodiment of the present invention will be described with reference to FIGS. 1 to 11.

The first embodiment will be described in relation to an EFMPP encoding method and an 8-bits/15-bits conversion encoding method, for example.

Figure 1:
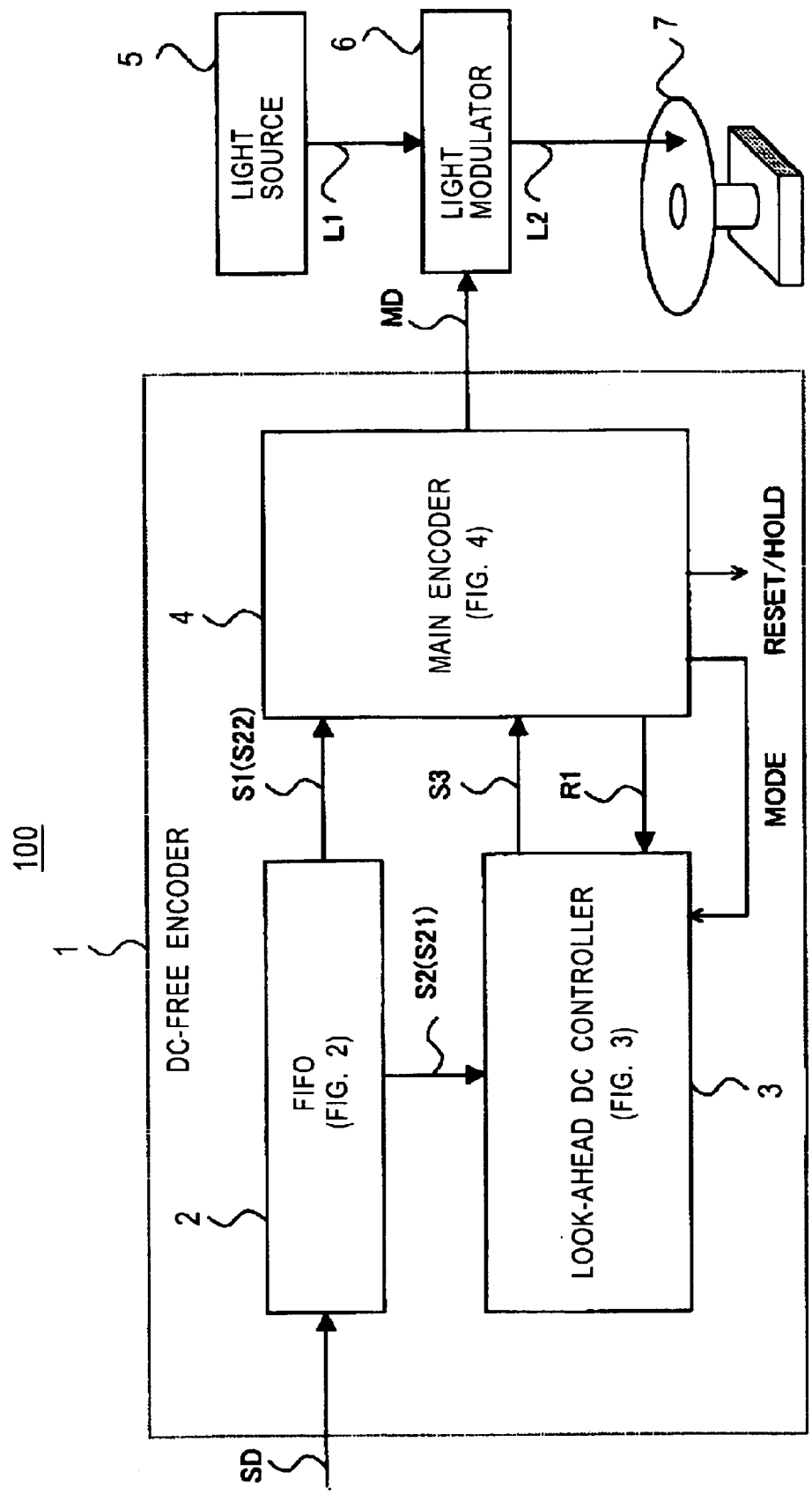
FIG. 1 is a block diagram of a DC-free encoding apparatus according to a first embodiment of the present invention.

According to this embodiment, an encoder 100 includes a DC-free encoder 1, a laser light source 5, and an optical modulator 6, as shown in FIG. 1. This encoder 100 can be used for a master processing device of an optical disk 7.

DC-free Encoder

The DC-free encoder 1 includes a first-in and first-out (FIFO) memory 2, a look-ahead DC controller 3, and an encoder mapping unit 4 functioning a main encoder.

DC-free encoding means encoding that is free from a DC component.

Look-ahead encoding method allows for encoding by using not only a data word that currently needs to be encoded, but also a data word to be encoded next and a data word to be encoded after that. That is to say, this look-ahead encoding method allows for encoding the data word that currently needs to be encoded by using at least one data word to be encoded next. A memory depth (length) M of the FIFO memory 2 that will be described later is determined based on the number of the data words to be encoded.

Upon receiving an input-source data signal SD, the encoder 100 generates an output-modulation data signal MD. The input-source data signal SD includes information that should be stored onto the optical disk 7, where the information includes sound data, computer data, and so forth. The output-modulation data signal MD includes the same information as that of the input-source data signal SD, where the information is encoded.

The laser light source 5 emits continual laser light L1 for recording encoded data onto the optical disk 7 and the laser light L1 passes through the optical modulator 6. The optical modulator 6 is controlled by the output-modulation data signal MD from the DC-free encoder 1 so as to generate on/off-modulated light L2. A glass master covered by a photosensitive micro film of the optical disk 7 is irradiated with the modulated light L2. After developing and replication are performed, a disk with the information data stored thereon is obtained, where the disk has pits and lands.

The operation cycle of the DC-free encoder 1 is started by loading a current input-source data signal SD into the FIFO memory 2. At the same time, the look-ahead DC controller 3 synchronizes the encoder mapping unit 4 and an internal register of the look-ahead DC controller 3 through a state-transfer signal R1 output from the encoder mapping unit 4. Then, the look-ahead DC controller 3 receives a data word S2 stored in the FIFO memory 2 and outputs a redundant signal S3 as a result. At the final step of the encoding, the encoder mapping unit 4 translates a current data word S1 from the FIFO memory 2 and the redundant signal S3 into the output-modulation data signal MD.

FIFO Memory

Figure 2:
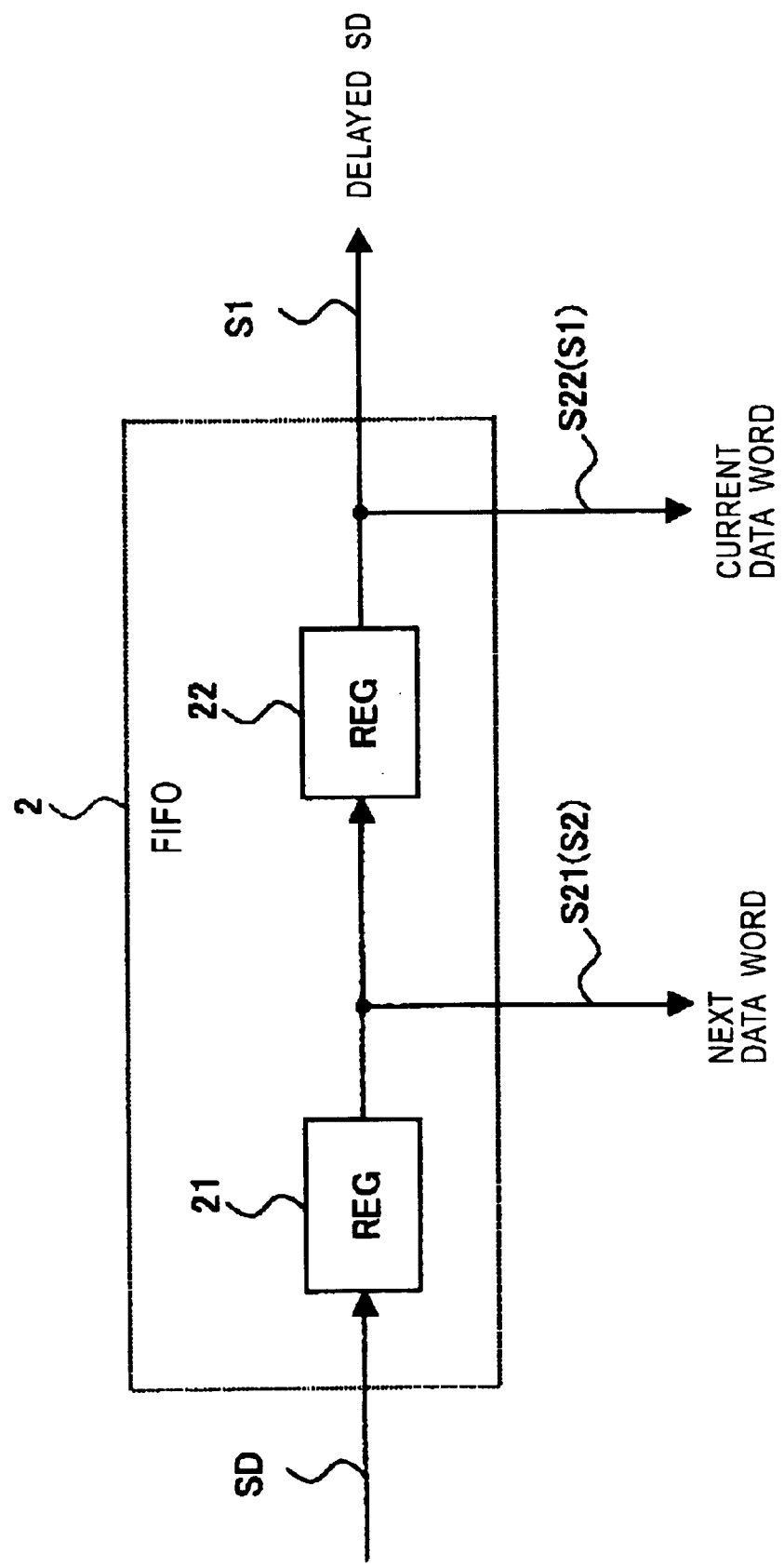
FIG. 2 is a circuit diagram of a FIFO memory shown in FIG. 1.

FIG. 2 illustrates an example configuration of the FIFO memory 2, where the memory depth (length) M thereof is two. The FIFO memory 2 includes two registers 21 and 22 that are continuously connected with each other. The current data word to be encoded S1 is stored in the register 22 at a rear stage, and the data word S2 to be encoded next waits in the register 21 at the front stage. The current data word and the next data word stored in the registers 21 and 22 can be used, as signals S21 and S22, by the look-ahead DC controller 3. The current data word to be encoded S1 (the signal S22) is transmitted to the encoder mapping unit 4.

Look-ahead DC Controller

For determination, known DC-controller circuits use only a current data word to be encoded. However, according to this embodiment, the look-ahead DC controller 3 shown in FIG. 3 uses at least one data word to be encoded next, other than the current data word. Further, a search is thoroughly performed for every conceivable combination of redundant bits for M data words to be encoded, where the M data words are stored in the FIFO memory 2 and the value of the memory depth (length) M of the FIFO memory 2 is two.

The look-ahead DC controller 3 in this drawing includes a redundant-data generation unit 31, a pre-encoding bit sequencer 32, a digital-integration unit 33, a peak-hold unit 34, and a minimum-value detector 35.

A redundant-data generation unit 31 includes four redundant-data generators $31n$ (n=1 to 4) independent of one another. These redundant-data generators $31n$, that is, an RED "00", an RED "01", an RED "10", and an RED "11" generate binary redundant data "00", "01", "10", and "11", respectively.

The pre-encoding bit sequencer 32 includes four parallel-encoder mapping units $32n$ (n=1 to 4) independent of one another. FIG. 5 illustrates the circuit configuration of one of these parallel-encoder mapping units $32n$ provided in the look-ahead DC controller 3. The circuit configuration of the parallel-encoder mapping unit $32n$ is the same as that of the encoder mapping unit 4 described with reference to FIG. 4. The parallel-encoder mapping unit $32n$ performs encoding processing before the encoder mapping unit 4 performs encoding processing. The encoding processing performed by the parallel-encoder mapping unit $32n$ will be described later.

Figure 8:
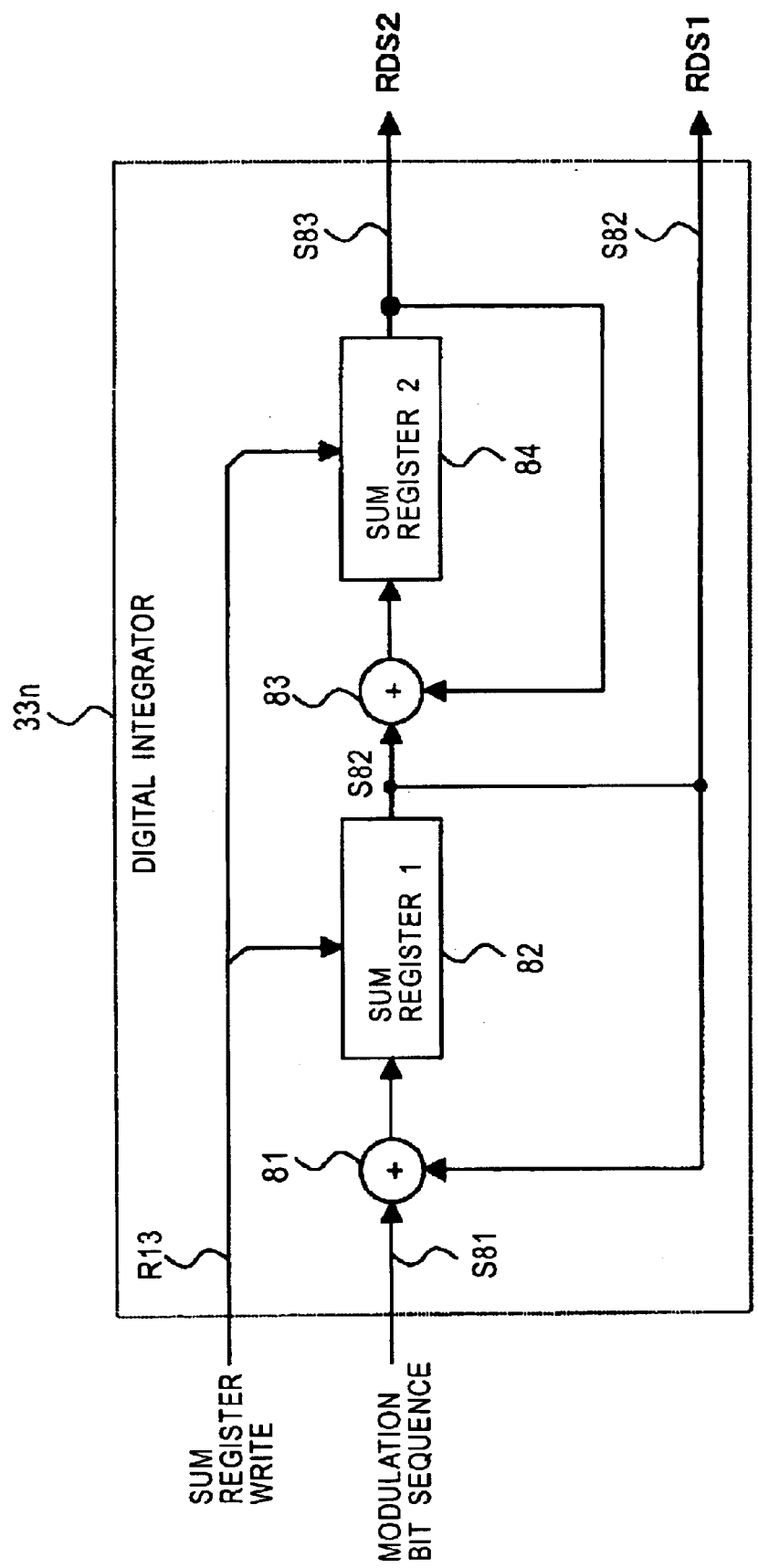
FIG. 8 is a circuit diagram of a digital integrator.

The digital-integration unit 33 includes four digital integrators $33n$ (n=1 to 4) independent of one another. FIG. 8 illustrates the circuit configuration of one these digital integrators $33n$.

Figure 9:
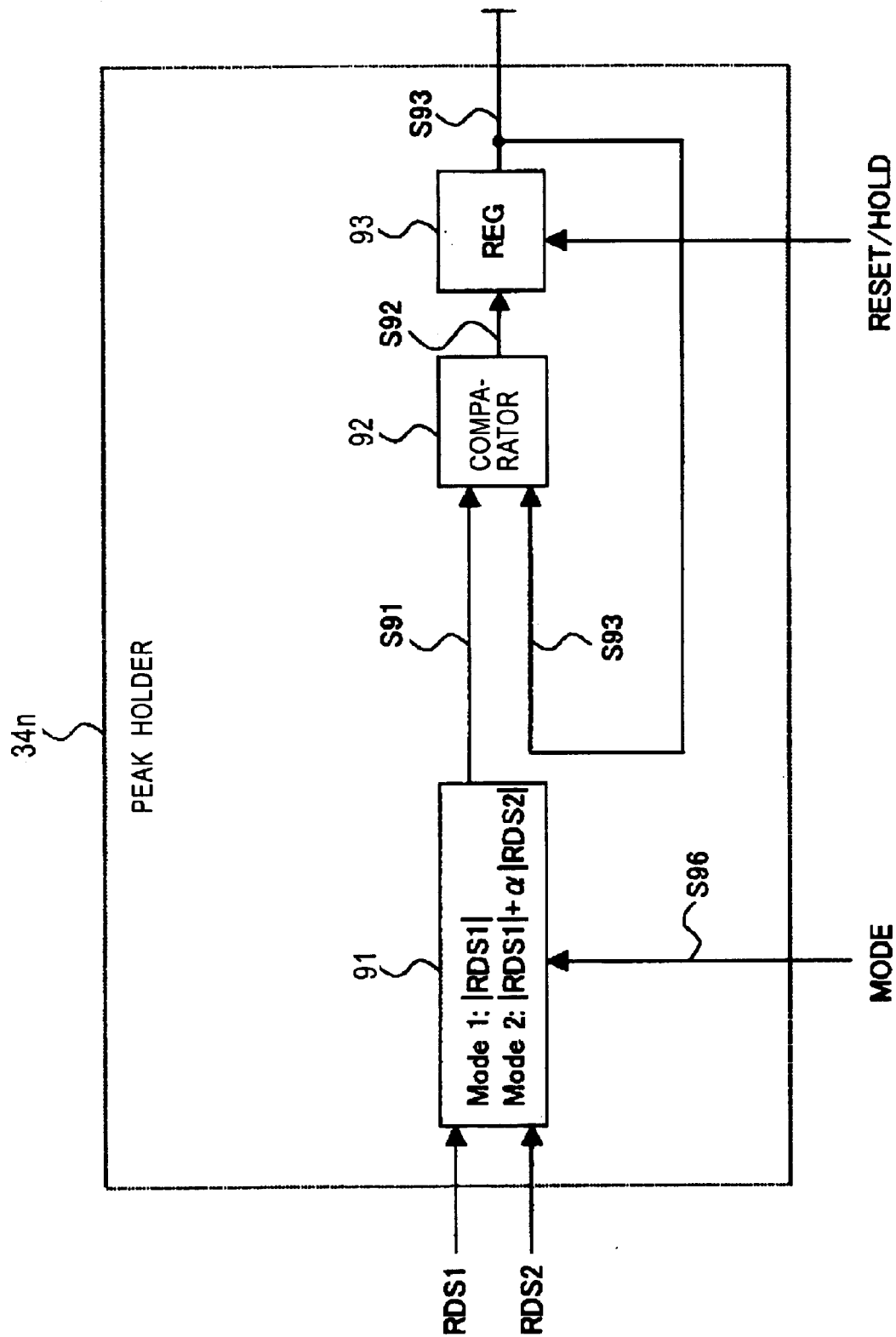
FIG. 9 is a circuit diagram of a peak-holder circuit.

The peak-hold unit 34 includes four peak holders 34n (n=1 to 4) independent of one another. FIG. 9 illustrates the circuit configuration of one of these peak holders 34n.

For encoding the current data word to be encoded, the look-ahead DC controller 3 scores every conceivable encoding method by referring to the current data word to be encoded and at least one data word to be encoded next. Then, the look-ahead DC controller 3 determines a most suitable redundant bit for the current data word S22 to be encoded.

Figure 4:
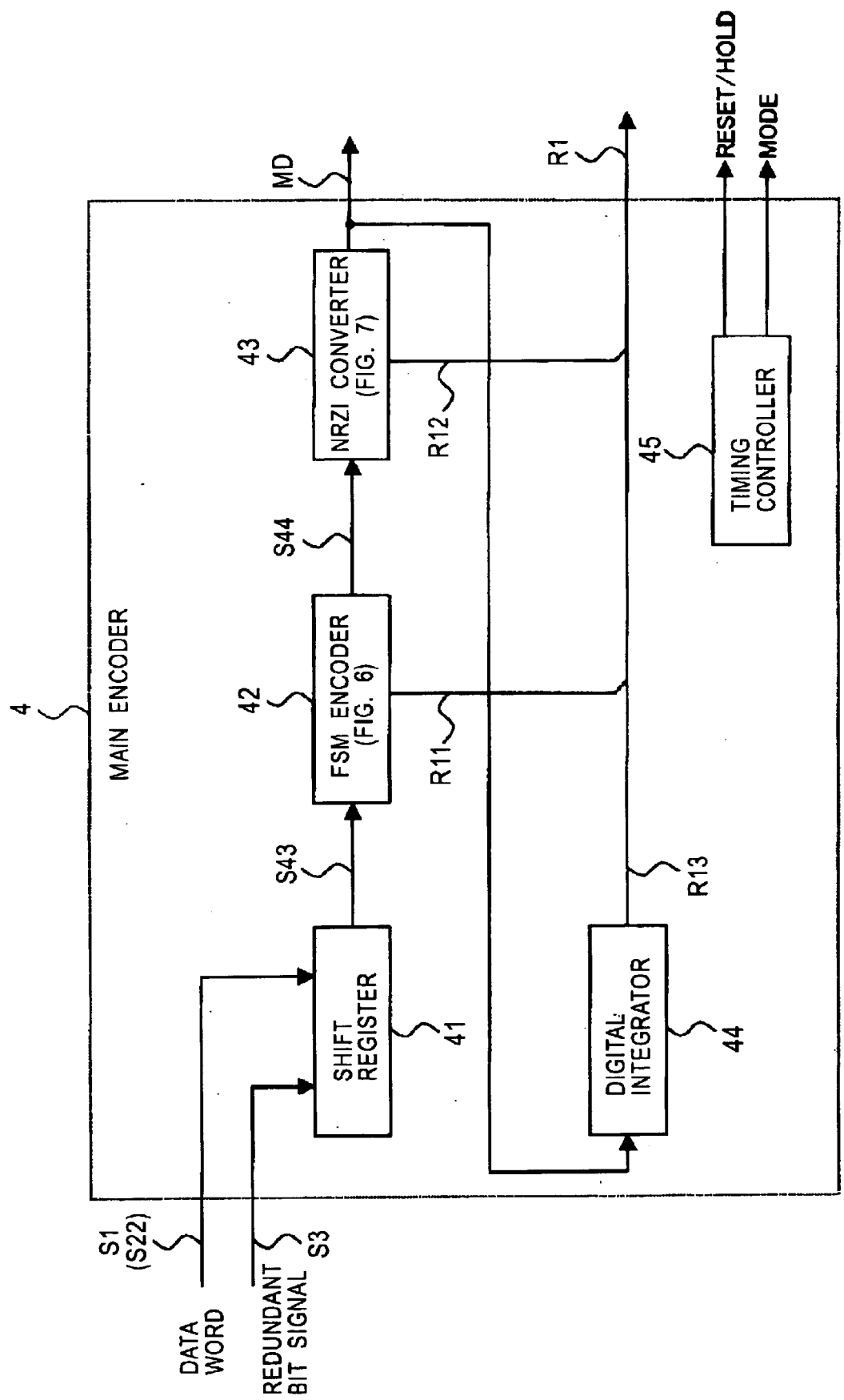
FIG. 4 is a circuit diagram of an encoder mapping circuit shown in FIG. 1.
Figure 5:
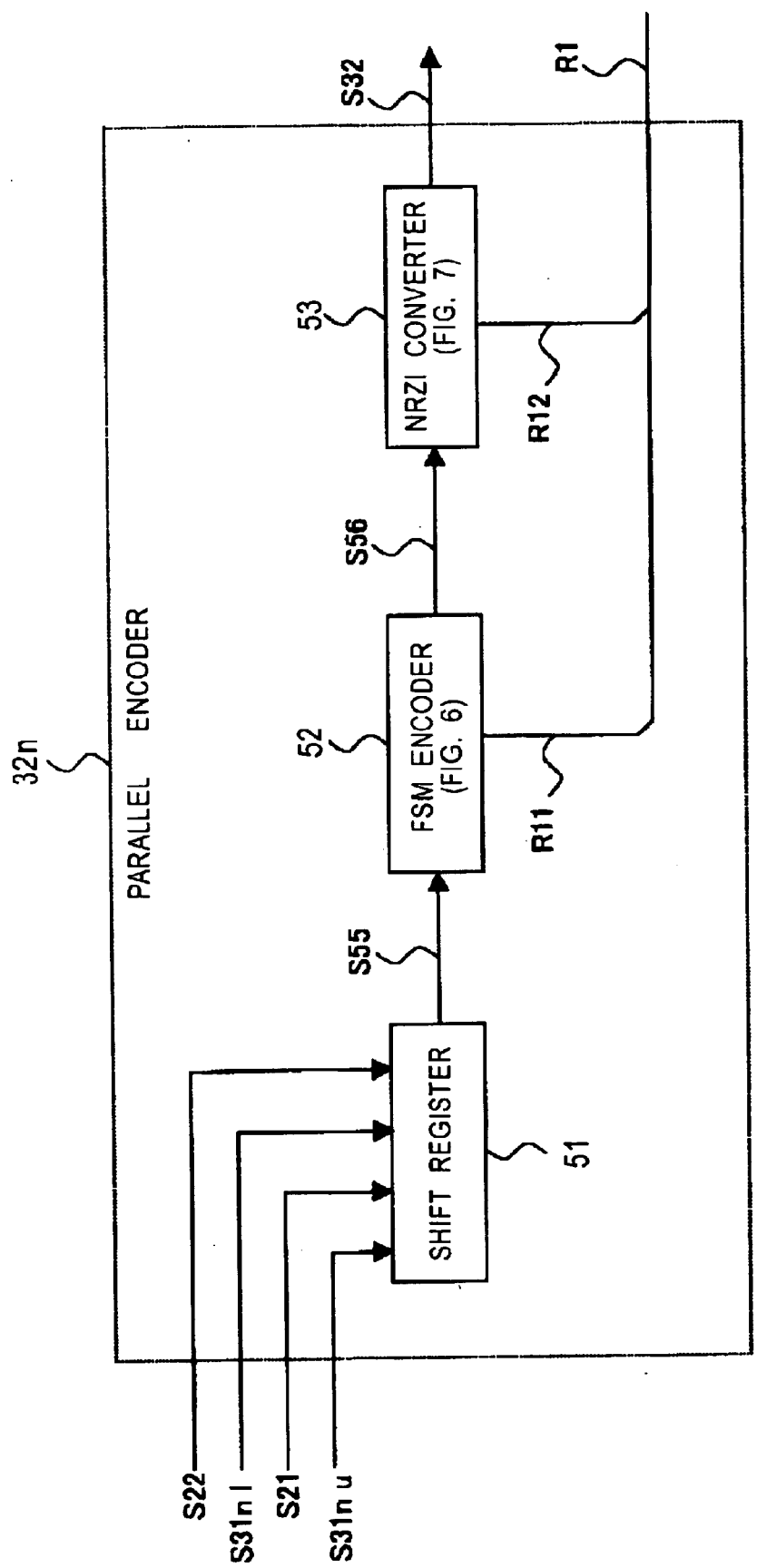
FIG. 5 is a circuit diagram of a parallel-encoder mapping circuit shown in FIG. 3.

Registers of the four parallel-encoder mapping units 32n in the pre-encoding bit sequencer 32 and registers of the four digital integrators 33n (n=1 to 4) in the digital-integration unit 33 are synchronized with one another by using the value of the state-transfer signal R1 including signals R11, R12, and R13 transmitted from the encoder mapping unit 4 shown in FIG. 4. Consequently, the search performed by the look-ahead DC controller 3 is initialized.

After the initialization, a search is performed by each of the parallel-encoder mapping units 32n, and the signal S21 (the current data word to be encoded) and the signal S22 (the next data word to be encoded) that are output from the FIFO memory 2 are pre-encoded for each of the conceivable redundant data "00", "01", "10", and "11" from the redundant-data generators 31n, before the encoder mapping unit 4 performs encoding. Redundant data XY includes "00", "01", "10", and "11". The lower place Y relates to the signal S22 (the current data word to be encoded) and the higher place X relates to the signal S21 (the next data word S21 to be encoded).

In the digital integrator 33, a running digital sum (RDS) signal S33 is calculated for a signal 32 obtained by the pre-encoding bit sequencer 32. The calculated RDS signal S33 is held at the peak holders 34n (n=1 to 4) of the peak-hold unit 34 and monitored by the minimum-value detector 35. Subsequently, a maximum absolute-value RDS signal 34 is obtained. That is to say, after pre-encoding processing for the signal S22 (the current data word to be encoded) and the signal S21 (the next data word to be encoded) is performed by the pre-encoding bit sequencer 32, the minimum-value detector 35 finds a path with a minimum boundary near a maximum absolute-value RDS signal S34n of the RDS signals S33 held in the four peak holders 34n (n=1 to 4). Further, the minimum-value detector 35 determines redundant-bit data S3 for the signal S22 (the current data word to be encoded). If a path for the redundant data "00" or "01" has a minimum boundary, the minimum-value detector 35 outputs a redundant value "0". However, if a path for the redundant data "10" or "11" has the minimum boundary, the minimum-value detector 35 outputs a redundant value "1".

After the look-ahead DC controller 3 determined the redundant value S3, the encoder mapping unit 4 can encode the signal S22 (the current data word to be encoded) by using the redundant value S3.

Main Encoder

FIG. 4 is a circuit diagram of the encoder mapping unit 4 illustrated in FIG. 1.

The encoder mapping unit 4 as the main encoder includes a shift register 41, a finite state machine (FSM) encoder 42, a non-return-to-zero inverse (NRZI) converter 43, a digital integrator 44, and a timing controller 45.

Figure 6:
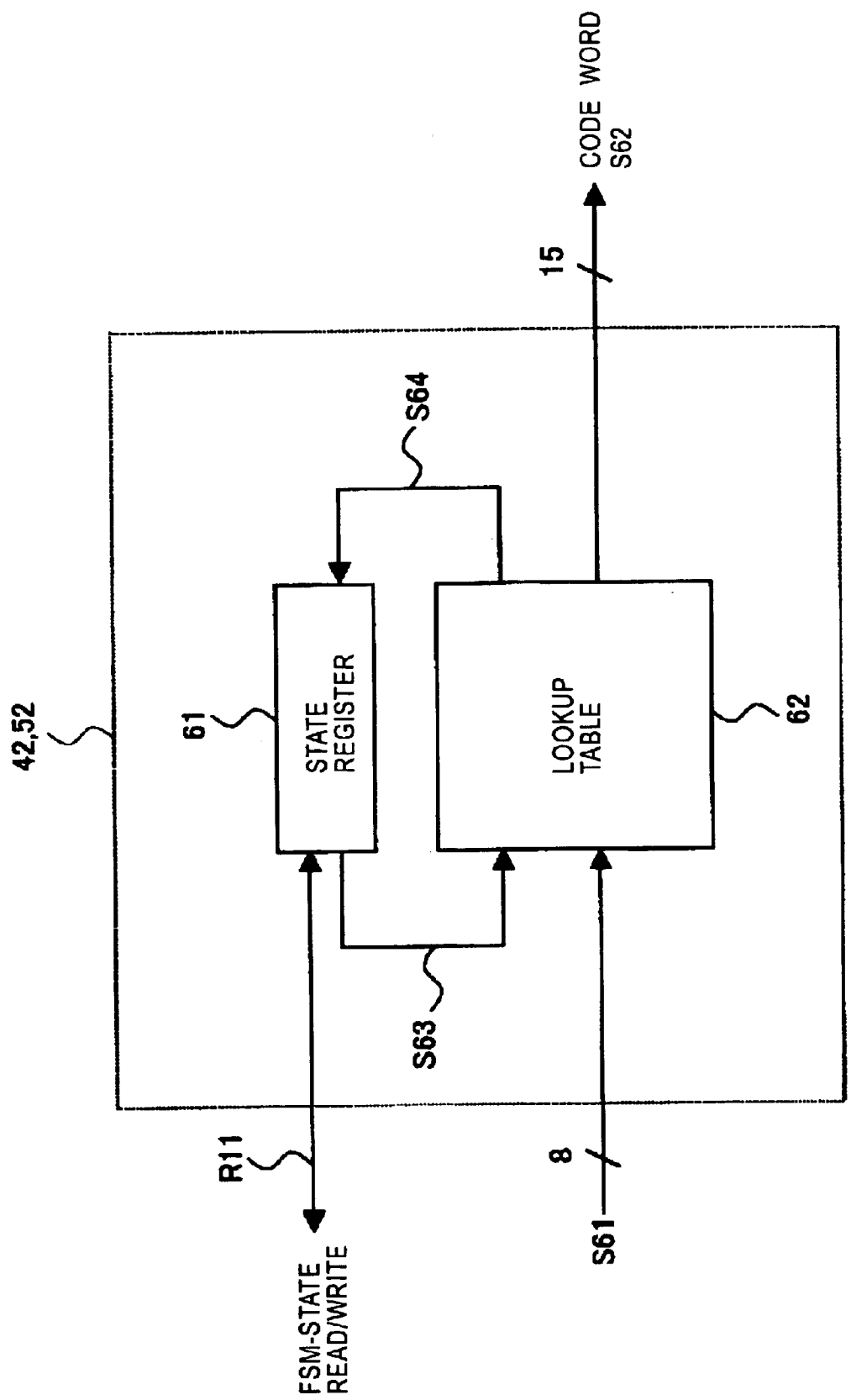

The redundancy bit signal S3 and the signal S22 (the current data word to be encoded S1) are stored in the shift register 41. The shift register 41 outputs its contents (data) as a sequence of 8-bit words S43 to the FSM encoder 42 whose circuit configuration is shown in FIG. 6. The FSM encoder 42 performs a state dependent 8-bits/15-bits translation in a look-up table 62. That is to say, in the look-up table 62, encoded data output from the shift register 41 is translated according to the value of data stored in a state register 61 shown in FIG. 6.

The resulting 15-bit code words obtained by the FSM encoder 42 satisfy the run-length constraints required for the optical-disk mastering.

Figure 7:
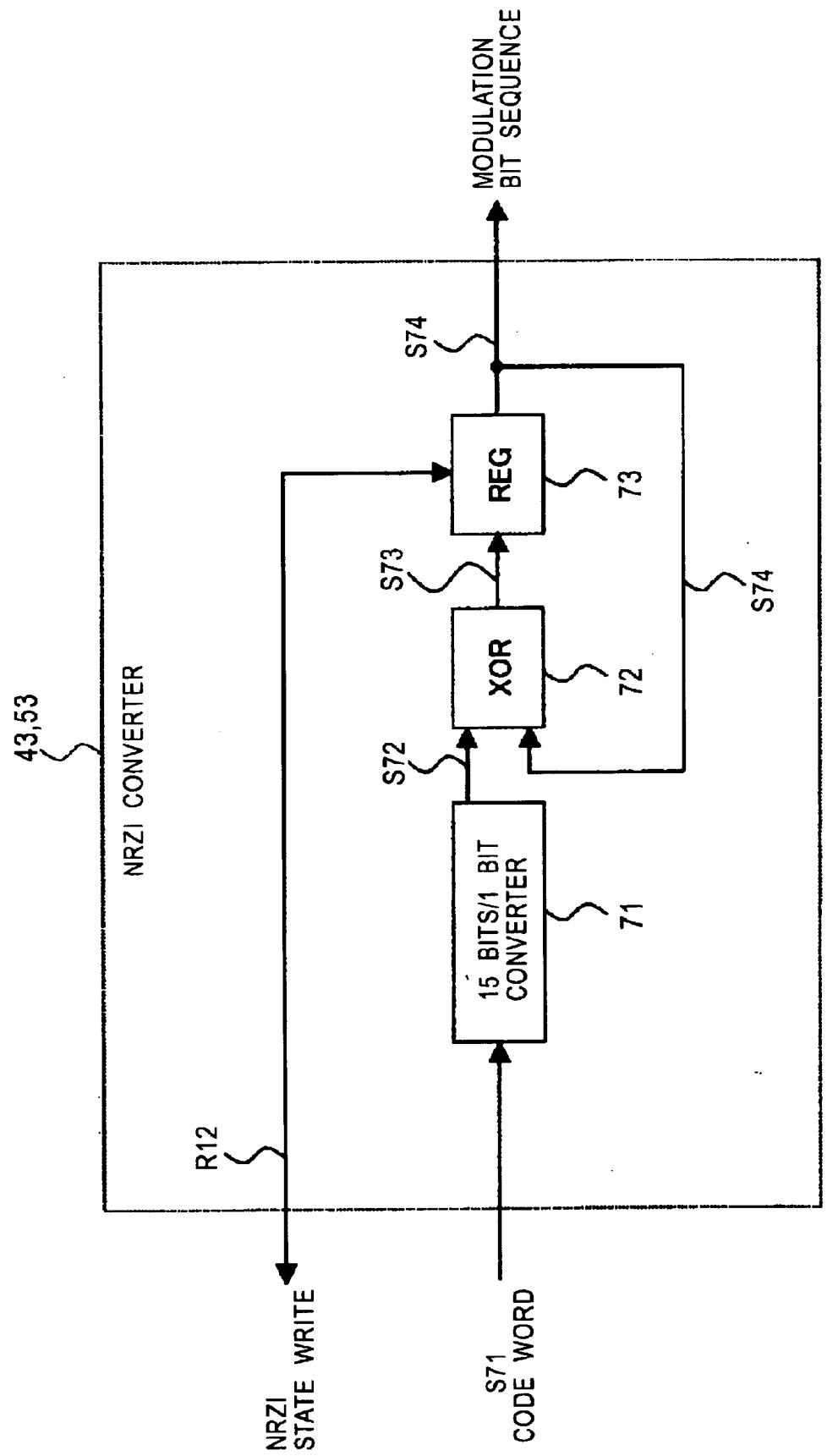
FIG. 7 is a circuit diagram of an NRZI converter shown in FIG. 4.

The 15-bit code words are then converted by the NRZI converter 43 into a final NRZI encoded modulation bit-sequence signal MD for the optical-disk mastering and applied to the light modulator 6. FIG. 7 illustrates the circuit configuration of the NRZI converter 43.

The timing controller 45 outputs a mode signal MODE and a reset/hold signal RESET/HOLD.

For synchronizing the look-ahead DC controller 3 with the encoder mapping portion 4, the first state signal R11 from the FSM encoder 42 to the pre-encoded bit sequencer 32, the second state signal R12 from the NRZI encoder 43 to the pre-encoded bit sequencer 32 and the third state signal R13 from the digital integrator 44 to the digital integrator portion 33 are grouped into a common state-transfer signal R1 and transmitted to the look-ahead DC controller 3.

Pre-encoded Bit Sequencer

FIG. 5. shows a circuit configuration of one of the four parallel-encoder mapping portions 32n, where n=1 to 4, of the pre-encoded bit sequencer 32 used for the look-ahead DC controller 3. The circuit configuration of the parallel-encoder mapping portion 32n is similar to that of the encoder mapping portion 4 shown in FIG. 4.

The parallel encoder mapping portion (parallel encoder) 32n (n=1 to 4) includes a shift register 51, a finite state machine (FSM) encoder 52, and a non-return-to-zero inverse (NRZI) converter 53.

The shift register 51 inputs the current data word S22, the next data word S21, and a redundant-bit signal S31n including a lower bit $S31n_L$ and a high bit $S31n_U$ output from the redundant-data generator 31n corresponding to the parallel-encoder mapping portion 32n. The shift register 51 then converts the input current data word S22, subsequent data word S21, and the redundant-bit signal S31n into an 8-bit word sequence data S55.

According to state dependent translation performed by the state register 61 in the FSM encoder 52 shown in FIG. 6 and the look-up table 62, the 8-bit word sequence data S55 is translated into a 15-bit code word S56.

FIG. 7 illustrates a circuit configuration of an NRZI converter 53 for translating a 15-bit code word into a serial NRZI bit stream S32.

Figure 3:
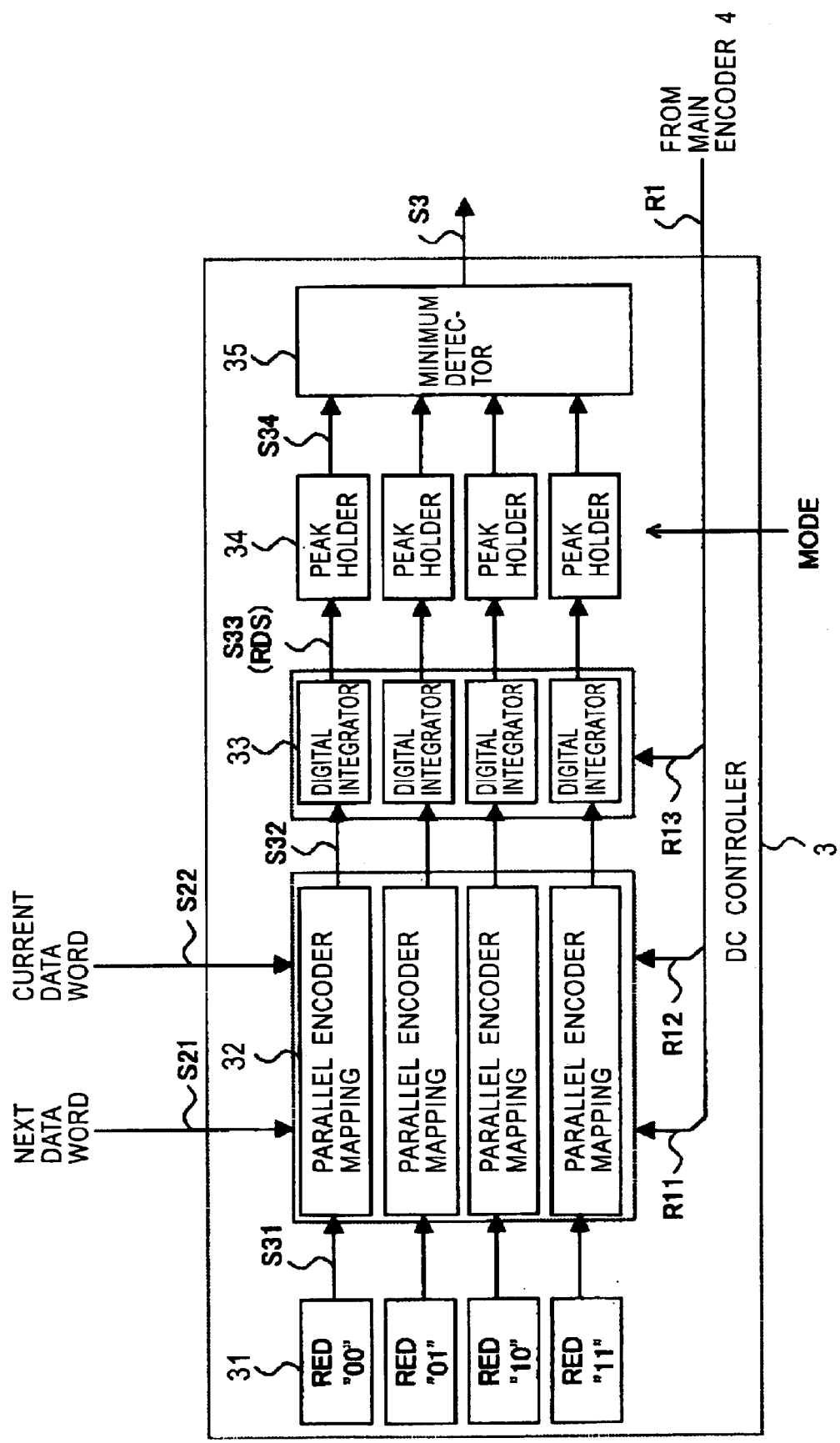
FIG. 3 is a circuit diagram of a DC-control circuit shown in FIG. 1.

The serial NRZI bit stream S32 is used for processing in the digital integrator portion 33 and the peak hold portion 34 shown in FIG. 3.

The parallel-encoder mapping portion 32n shown in FIG. 5 receives the state-transfer signal R1 from the main encoder 4 for initialization. This state-transfer signal R1 synchronizes the state of the FSM encoder 52 with the main encoder 4, by using the state signal R11, and further synchronizes the state of the NRZI converter 53 with the main encoder 4, by using the state signal R12 for each encoding cycle.

FSM Encoder

The FSM encoders 42 and 52 are shown in FIG. 6 and are the heart of both the main encoder 4 and the parallel-encoder mapping portion 32n (n=1 to 4).

The main object of the FSM encoders 42/52 is to translate an 8-bit input word sequence S61 (S43 and S55) output from the shift registers 41 and 51 into a 15-bit output word sequence S62 (S44 and S56), by using a state dependent method. The translation is performed by the lookup-table 62, which maps the data word S61, depending on the data S63 from the state register 61, to a code word S62 and a subsequent state signal S64. After each translation, the subsequent state S64 is transferred to the state register 61 and used for the next translation. The content of the state register 61 is accessible through the state signal R11 and the look-ahead DC controller 3 synchronizes the FSM encoder 42 in the main encoder 4 and the parallel-encoder mapping portions 32n in the look-ahead DC controller 3.

The output code word S62 generated by the FSM encoder 52 has to satisfy minimum and maximum run-length constraints and restrictions imposed by the mastering process of the optical disk 7.

Since it is not relevant to the present invention, the description and illustration of the precise design procedure or contents of the look-up table 62 are omitted here. However, a detailed explanation of algorithms for the design of such state-machine generating run-length constraint codes is disclosed in, for example, (a) Immink, Patrovies, "Performance Assessment of DC-free Multimode Codes.", IEEE Transactions on Communications, Vol. 45, No. 3, March 1997, (b) Immink, Siegel, Wolf, "Codes for Digital Recorders", IEEE Transactions on Information Theory, Vol. 44, No. 6, March 1998, and (c) Marcus, Siegel, Wolf, "Finite-State Modulation Codes for Data Storage", IEEE Journal on Selected Areas in Communications, Vol. 10, No. 1, January 1992.

The finite-state machines as designed with the methods disclosed in the above-described references typically generate NRZ code sequences for forming the modulation bit sequence, the code must be converted into an NRZI bit sequence by the NRZI converter 43 in FIG. 4 and the NRZI converter 53 in FIG. 5.

NRZI Converter

The NRZI converter 43/53 shown in FIG. 7 includes a 15-bit/1-bit converter 71 for converting 15-bit data into 1-bit data, an exclusive-OR (XOR) gate 72, and a register 73. The circuit configuration of the NRZI converter 43 is the same as that of the NRZI converter 53.

The NRZI converter 43/53 receives a 15-bit code word S71 from the FSM encoder 42/52 and transforms the code word S71 into a modulation bit sequence S74. Namely, the 15-bit code word is first converted into a plain bit sequence S72 by the 15-bit/1-bit converter 71. The XOR gate 72 calculates an exclusive OR of the output signal S72 from the 15-bit/1-bit converter 71 and a result S74 that was previously obtained and held in the register 73. That is to say, if the value of the signal S72 is the same as that of the result S74, the value of an output from the XOR gate 72 becomes zero. Otherwise, the value thereof becomes 1, and the obtained result is held in the register 73. The output from the register 73 is the result of the NRZI conversion. In the case of the NRZI converter 43 in the main encoder 4, the NRZI-conversion result is output as an output modulation data signal MD to the light modulator 6. In the case of the NRZI converter 53 in the parallel-encoder mapping portion 32n, the NRZI-conversion result is output to the digital integrator 33n.

The state signal R12 allows for making the state of the NRZI converter 43/53 readable and writable for synchronizing the NRZI converter 43/53 or the parallel-encoder mapping portion 32n in the look-ahead DC controller 3 with the main encoder 4.

Digital Integrator

As shown in FIGS. 4 and 5, the NRZI converter 43/53 is followed by the digital integrator 33, which calculates an RDS over the modulation bit sequence. FIG. 8 illustrates a configuration of one of the digital integrators 33n (n=1 to 4) of the employed digital integrator portion 33. The digital integrator 33n includes two successive integration loops in series with each other. One of the integration loops is a first integration loop (a first integration circuit) including a first adder 81 and a first register 82 and calculates a first RDS1. The other thereof is a second integration loop (a second integration circuit) including a second adder 83 and a second register 84 and calculates a second RDS2 that is the accumulation of the first RDS1.

The first integration circuit functions as an up/down counter. The content of the register 82 is decreased by one, where each modulation bit sequence is a binary "0", and increased by one, where each modulation bit sequence is a binary "1". The second integrator including the second adder 83 and the second register 84 successively accumulates the output signal 382 of the first integration loop (integrator), thereby generating a second-order digital sum value S83.

The read/write state signal R13 allows for transferring the content of the digital integrator 44 of the main encoder 4 to the pre-encoded bit sequencer 32 (the parallel-encoder mapping portion 32n) in the look-ahead DC controller 3, at the initialization step.

Peak Holder

FIG. 9 is a circuit diagram of one of the peak holders 34n of the peak-hold portion 34 shown in FIG. 3. The peak holder 34n includes an absolute-value calculation and selection circuit 91, a comparator 92, and a register 93.

A signal MODE and a signal RESET/HOLD signal are applied from the timing controller 45 of the main encoder 4 to the peak holder 34n.

The absolute-value calculation and selection circuit 91 receives the first RDS1 and the second RDS2 output from the corresponding digital integrator 33n shown in FIGS. 3 and 8 and calculates a first-order DC control value DC1 which is an absolute value of the first RDS1, that is, |RDS1|. The absolute-value calculation and selection circuit 91 further calculates the sum of the absolute value |RDS1| and α×|RDS2|. α×|RDS2| is a value obtained by multiplying the absolute value |RDS2| of the second RDS2 by a weighted coefficient α. Then, the absolute-value calculation and selection circuit 91 outputs either the first-order DC control value DC1 or the second-order DC control value DC2 according to the value of a signal MODE output from the timing controller 45. Namely, the absolute-value calculation and selection circuit 91 outputs the first-order DC control value DC1, when the value of the signal MODE is zero (MODE=0), and outputs the second-order DC control value DC2, when the value of the signal MODE is one (MODE=1)

The comparator 92 receives a selected signal S91 from the absolute-value calculation and selection circuit 91 and a signal S93 output from the register 93, compares the received signals S91 and S93 to each other, and outputs one of the signals, the signal having a larger value, to the register 93.

The register 93 holds the signal with a larger value output from the comparator 92 and outputs this signal to the comparator 92 for detecting a next maximum value.

Namely, the peak-holder 34n monitors the first-order and second-order digital sum values output from the digital integrator 33n, calculates the first-order DC control value DC1 and the second-order DC control value DC2, and detects and holds the maximum value of the first DC control value DC1 or the second DC control value DC2, according to the value of the mode signal MODE. The peak holders 34n can operate in two modes. Where the value of the mode signal MODE is one, the absolute value of the first RDS1 (the first-order control value DC1) becomes a subject of peak holding, and where the value of the mode signal MODE is two, the sum of the absolute value of the first RDS1 and a value obtained by multiplying the absolute value of the second RDS2 by a coefficient, that is, the second-order DC control value DC2 becomes a subject of peak holding. These operation modes are controlled by the mode signal MODE transmitted from the main encoder 4.

At the beginning of an encoding cycle, the register 93 is cleared by a reset signal RESET transmitted from the main encoder 4. During the encoding process, the comparator 92 compares the selection signal S91 output from the absolute-value calculation and selection circuit 91 according to the mode signal MODE and an output signal (the maximum value last time) S93 output from the register 93, and outputs the signal whose value is larger than that of the other to the register 93. At the end of the encoding cycle, the register 93 holds the obtained peak value (the maximum value) according to a hold signal HOLD output from the main encoder 4 and transmits the peak value to the minimum-value detector 35 of the look-ahead DC controller 3.

The minimum-value detector 35 detects a smallest value from among maximum first-order DC control values DC1 or maximum second-order DC control values DC2 that are detected by the plurality of the peak holders 34n and outputs the detected smallest value as the redundant signal S3 to the main encoder 4.

The main encoder 4 encodes the current data word to be encoded S1 (S22) output from the FIFO memory 2 by using the redundant signal S3 obtained by the look-ahead DC controller 3 and outputs the encoded data word S1 as an output-modulation data signal MD to the light modulator 6.

The redundant signal S3 obtained by the look-ahead DC controller 3, by referring to the current data word to be encoded and at least one data word to be encoded next, becomes a most suitable determination criterion for encoding the current data word to be encoded. The main encoder 4 determines an encoding tree that is most effective for suppressing a DC component by using the determination criterion.

Performance Assessments

Figure 10:
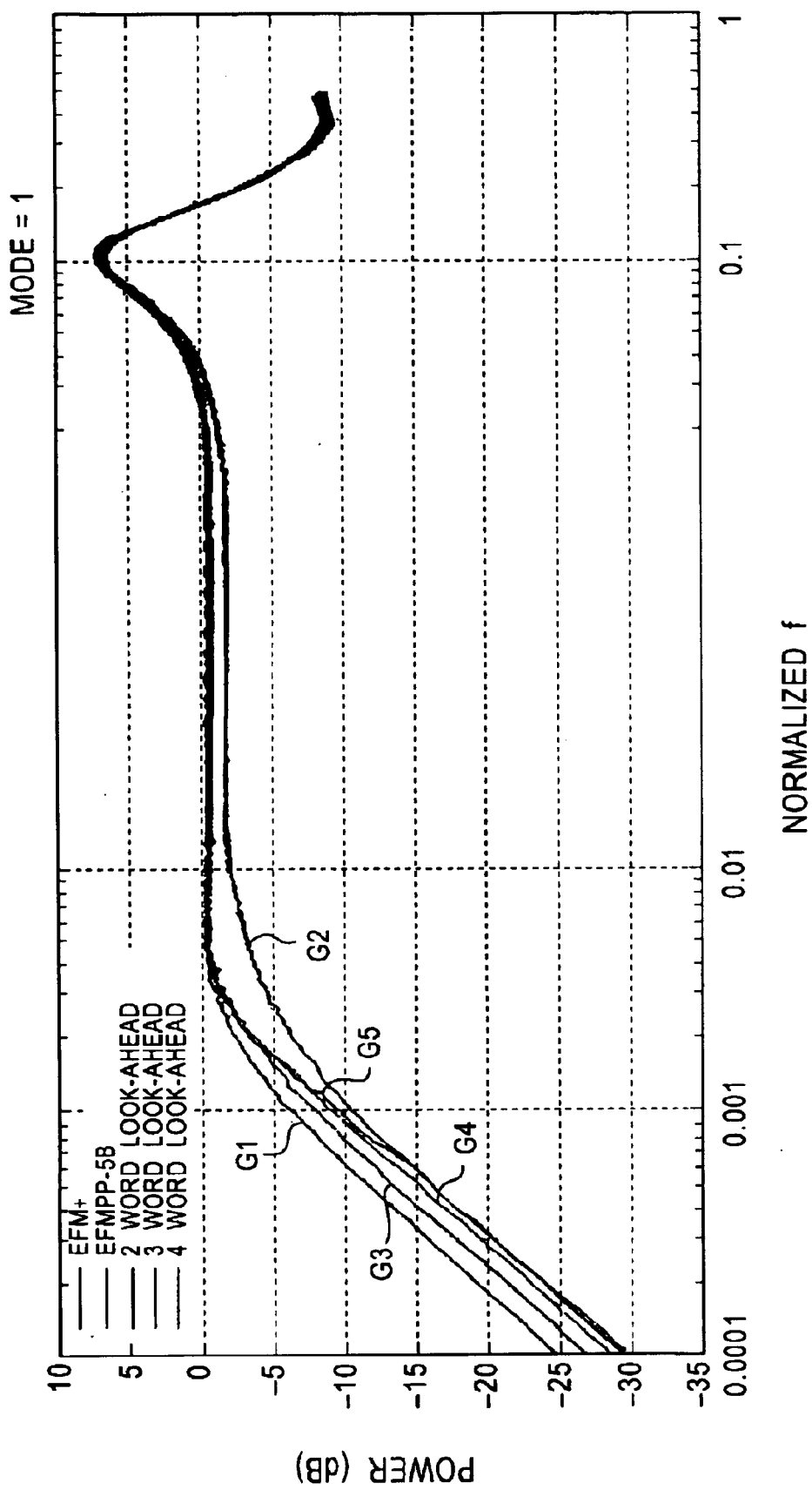
FIG. 10 is a graph illustrating the power-spectrum density of a random-encoding sequence, where only the first RDS 1 for DC control is used.
Figure 11:
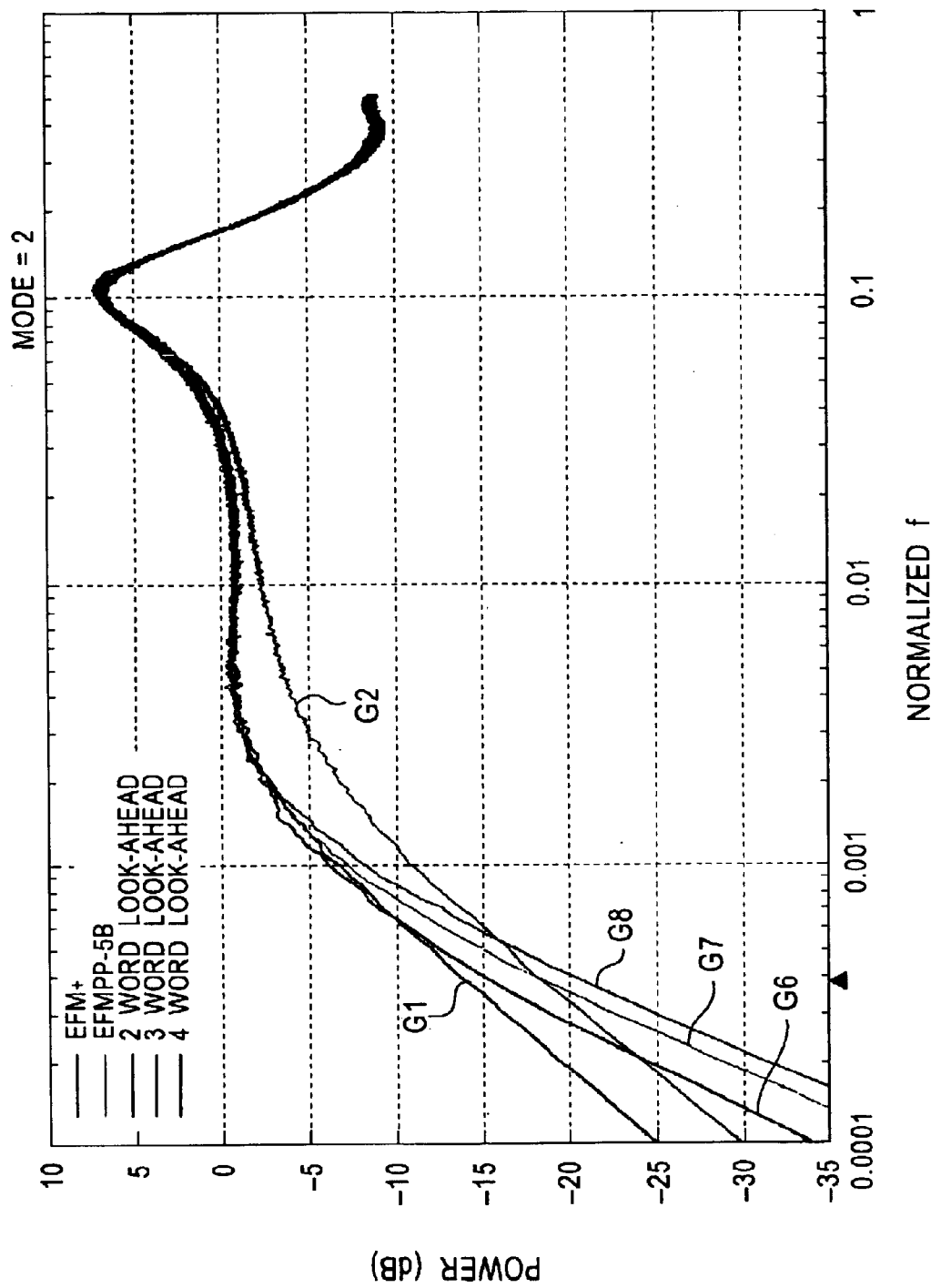
FIG. 11 is a graph illustrating the power-spectrum density of a random-encoding sequence, where only a first RDS 1 and a second RDS 2 for DC control are used.

Performance assessments of the above-described embodiment is shown as power-spectrum density measurement values shown in FIGS. 10 and 11. For these measurements, a long code sequence was generated from random data according to the above-described embodiment. At least one power spectrum was measured from this code sequence by using Fourier analysis techniques disclosed in a document, for example, Oppenheim, Schafer, "Discrete-Time Signal Processing", Prentice Hall, 1989. In each of these graphs shown in these drawings, an abscissa indicates a frequency normalized with respect to the clock frequency of a modulation code and an ordinate indicates the measurement value of an amplitude specified in decibel (dB).

FIG. 10 illustrates first performance of this embodiment. Where the peak holder 34n operates when the value of the mode signal MODE is one, the value of a first-order spectrum becomes zero (null) at 0 Hz. Namely, the low-frequency component of an obtained binary modulation sequence is effectively suppressed, whereby a first-order spectrum whose value is zero is generated at 0 Hz.

A curve G1 shows a power spectrum obtained by EFMPP encoding performed without using the look-ahead DC controller 3 shown in FIG. 1.

A curve G2 shows a power spectrum obtained by using an $EFM^+$ encoding format used for a DVD. The encoding efficiency of an EFMPP encoding format is higher than that of the $EFM^+$ encoding format. However, a low-frequency component obtained by the EFMPP encoding format is large.

Curves G3, G4, and G5 indicate the values of data words with look-ahead lengths (depths) M different with one another, such as two, three, and four. The look-ahead length is equivalent to the memory length (depth) of the FIFO memory 2. Each of the curves indicates a power spectrum, where the look-ahead DC controller 3 is used as an EFMPP encoder. As the look-ahead length M of the look-ahead DC controller 3 increases, the amount of DC-component suppression increases. In the case of the data word with the look-ahead length M=4, the quality of DC-component suppression is the same as in the case of $EFM^+$ encoding. Thus, the above-described DC control method allows for increasing the encoding efficiency and achieving good DC-component suppression.

The measurement results shown in FIG. 11 illustrate second performance of this embodiment, where the peak holder 34n operates when the value of the mode signal MODE is one and the value of a second-order spectrum becomes zero (null) at 0 Hz.

Curves GI and G2 indicate spectra of the EFMPP encoder and an $EFM^+$ encoder.

Curves G6, G7, and G8 indicate power spectra obtained when the values of the look-ahead lengths M are two, three, and four. Compared to the gains of corresponding curves shown in FIG. 10, where the gains at the low frequency are better than those in the case of the $EFM^+$ encoder, the gains of these curves G6, G7, and G8 decrease at a faster rate. As a result, the low-frequency component of an obtained binary modulation sequence is effectively suppressed and the value of the second-order spectrum becomes zero (null) at 0 Hz.

As shown in the graphs of FIGS. 10 and 11, this embodiment achieves improved DC-component suppression.

For recording data onto an optical-disk recording medium, the present invention allows for using an encoding method that can achieve a high encoding rate, such as the EFMPP encoding method whose encoding rate is higher than that of the $EFM^+$ encoding method used for currently used DVDs, while maintaining the quality of the DC-component suppression.

Although the above-described embodiment has been described by referring to the EFMP encoding method, the 8-bit/15-bit conversion encoder, and the optical-disk mastering, the present invention is not limited to this embodiment, but can be achieved in various forms.

Various encoding methods according to the present invention use a method similar to the EFMPP encoding method, by providing selection means for encoding a data word. Accordingly, improved DC-component suppression can be achieved. The utilization of the present invention is not limited to mastering of a recording medium formed as an optical disk. For example, the present invention can be used for a hard-disk or magnetic-table recording medium using a run-length limitation code, even though design parameter of the code construction thereof is different from that of the optical-disk recording medium.

Second Embodiment

A second embodiment of the present invention will now be described with reference to FIGS. 12 to 20.

This embodiment will be described in relation to an EFMCC encoding method.

Figure 12:
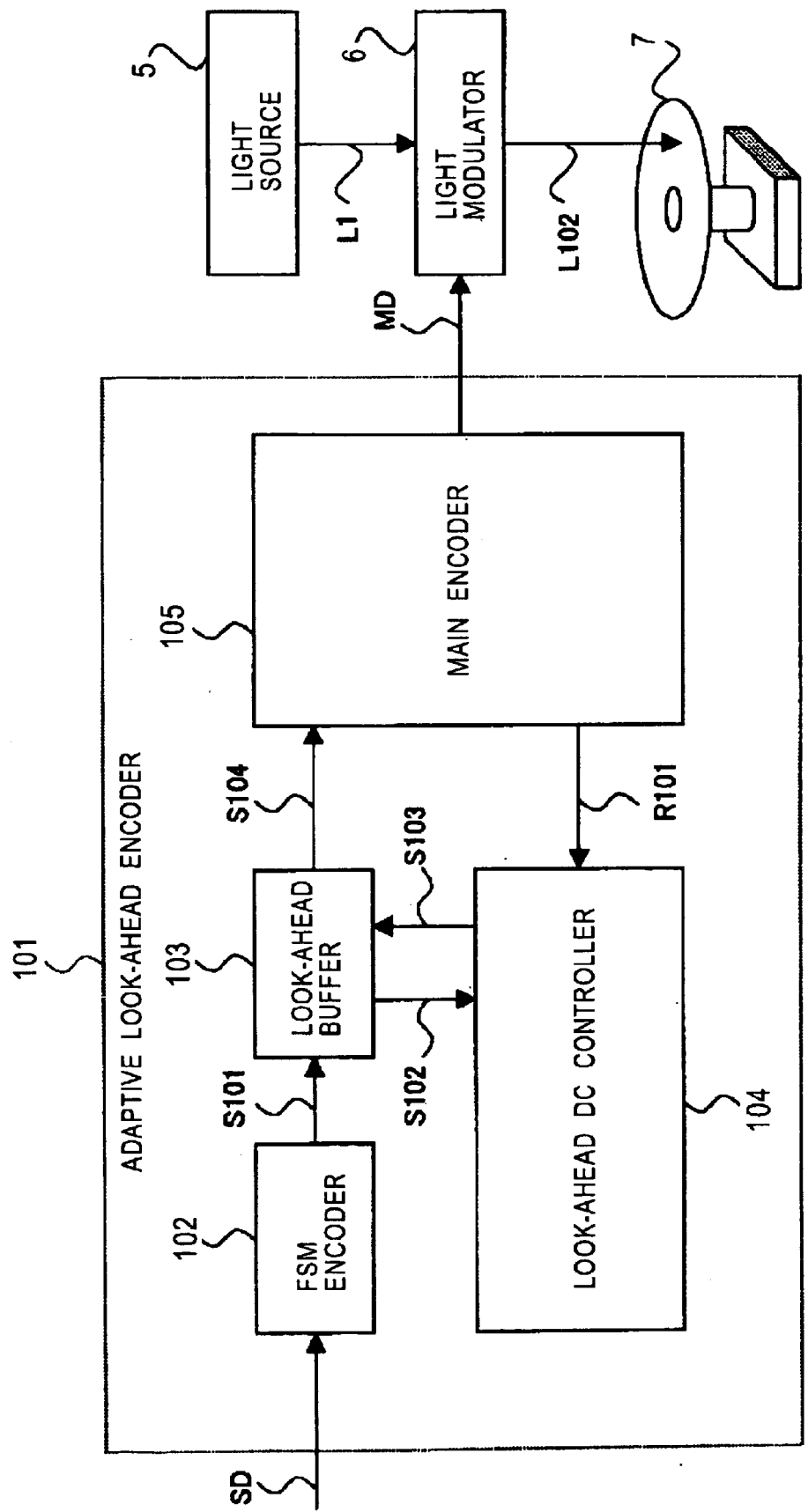
FIG. 12 is a block diagram of an adaptive look-ahead encoding apparatus according to a second embodiment of the present invention.

FIG. 12 illustrates the configuration of an encoding device 200 including an adaptive look-ahead encoder 101 that can be used for mastering an optical-disk recording medium.

The encoding device 200 further includes a laser-light source 5 for emitting continuous laser light, and a light modulator 6 for modulating laser light from the laser-light source 5 based on an ON/OFF modulation signal from the adaptive look-ahead encoder 101 and emitting the modulated laser light onto a glass master of the optical disk 7. This encoding device 200 is used for a mastering device of the optical disk 7.

The adaptive look-ahead encoder 101 includes an FSM encoder 102, a look-ahead buffer 103, a look-ahead DC controller 104, and a main encoder 105.

The adaptive look-ahead encoder 101 receives an input source data signal SD and generates an output modulation data signal MD. The input source data signal SD includes information such as sound data, computer data, and so forth that should be stored onto the optical disk 7. The output modulation data signal MD includes the same information as that of the input source data signal SD, where the information is encoded.

For recording the encoded data onto the optical disk 7, the laser-light source 5 emits continual laser light L1 that passes through the light modulator 6. The light modulator 6 is controlled by the output modulation data signal MD from the adaptive look-ahead encoder 101 and generates on/off-modulated light L102. The glass master covered by the photosensitive micro film of the optical disk 7 is irradiated with the modulated light L102. After developing and replication are performed, a disk with the original information data (the input-source data signal SD) stored thereon is obtained, where the disk has pits and lands.

The operation cycle of the adaptive look-ahead encoder 101 is started when the FSM encoder 102 encodes a new data segment of the input source data signal SD into two possible encoded segments S101.

The data segment is determined to be a sequence of words starting with at least one word for which at least one possible encoding method can be used and ending with the word before the next word, for which a plurality of encoding methods can be used.

Figure 13:
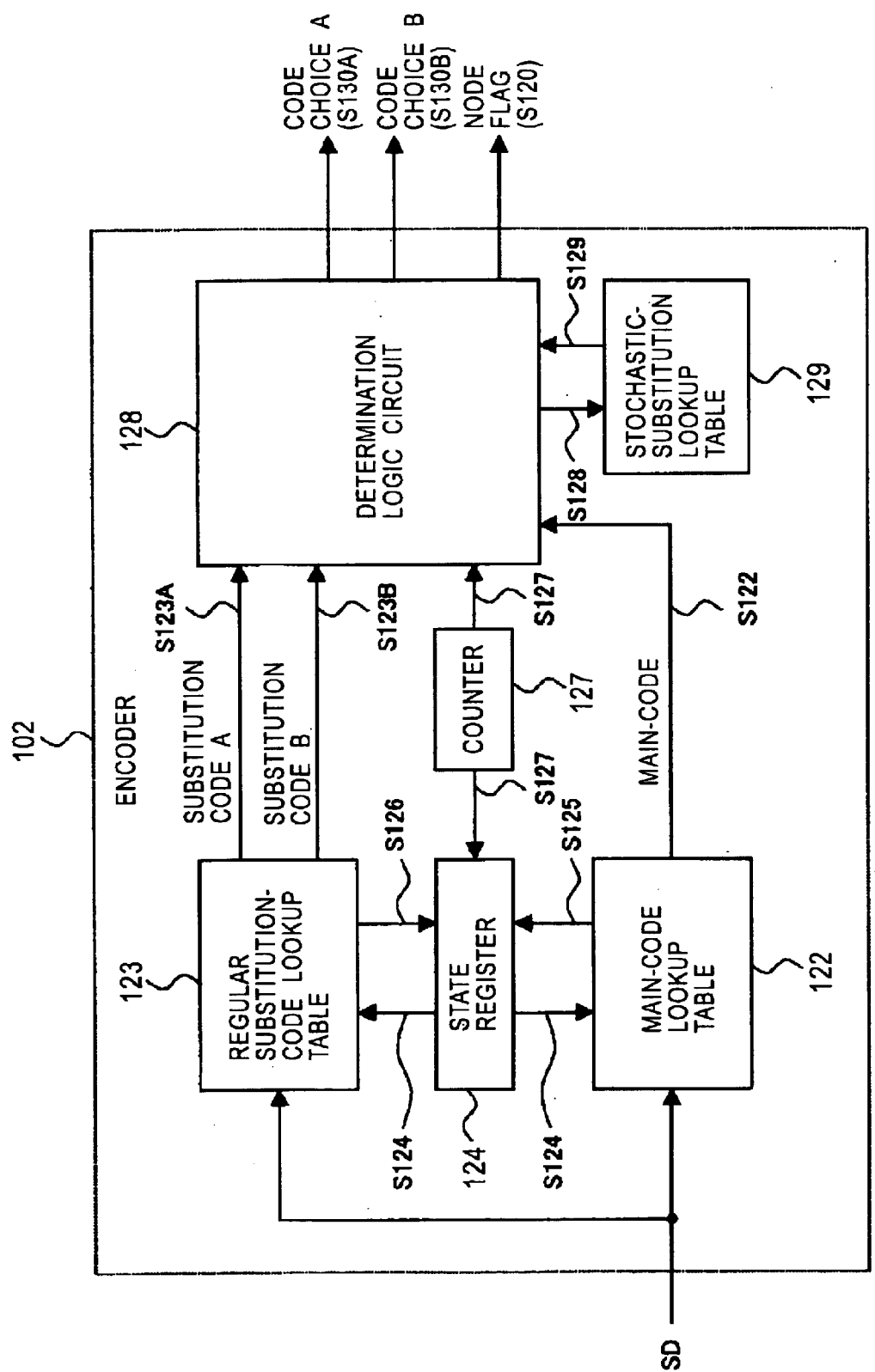
FIG. 13 is a circuit diagram of an FSM encoder shown in FIG. 12.
Figure 14:
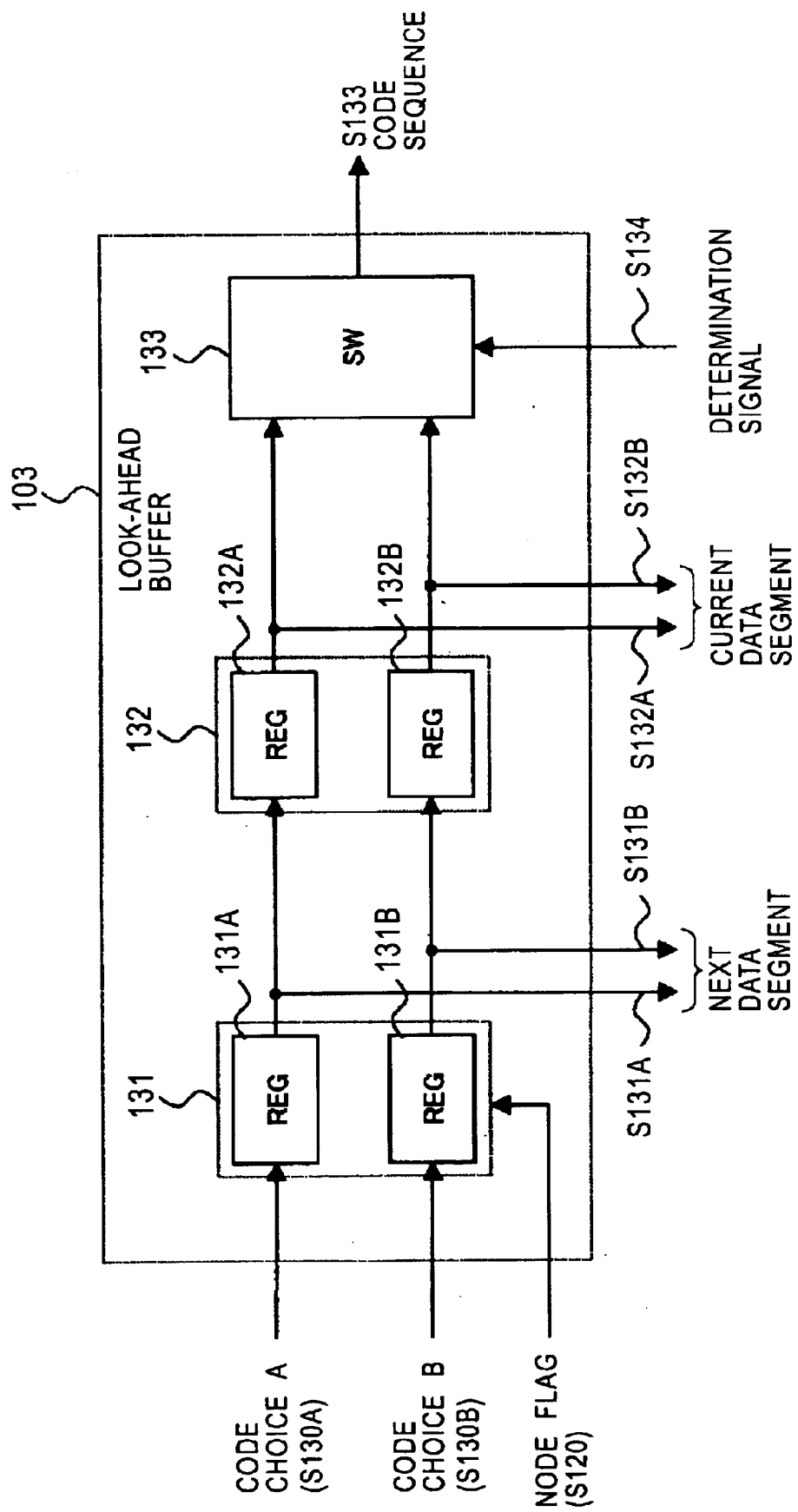
FIG. 14 is a circuit diagram of a look-ahead buffer shown in FIG. 12.

The segment S101 encoded by the FSM encoder 102 shown in FIG. 13 is loaded into a look-ahead buffer 103 shown in FIG. 14.

Figure 15:
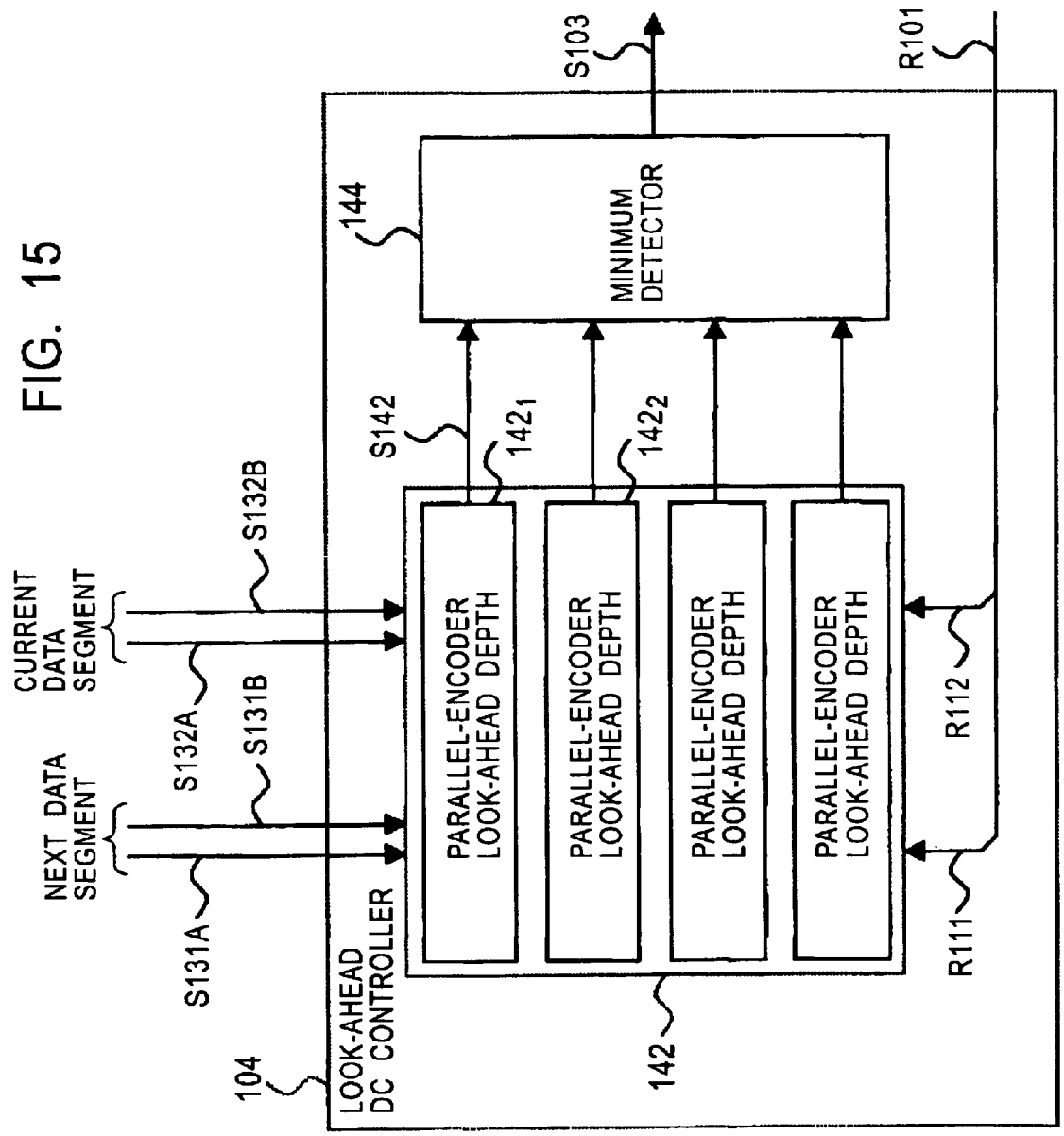
FIG. 15 is a circuit diagram of a look-ahead DC control circuit shown in FIG. 12.

A look-ahead DC controller 104 shown in FIG. 15 processes the data segment S102 stored in the look-ahead buffer 103 and outputs a determination signal S103. The determination signal S103 is used for selecting a most suitable current data segment to be encoded S104. A main encoder 105 shown in FIG. 16 converts the current data segment to be encoded S104 output from the look-ahead buffer 103 into an output-modulation data signal MD.

FSM Encoder

The FSM encoder 102 shown in FIG. 13 includes a main-code lookup table 122, a regular substitution-code lookup table 123, a state register 124, a counter 127, a logic determination circuit 128, and a stochastic-substitution lookup table 129.

The FSM encoder 102 encodes the input source data signal SD into two possible output-code selection signals A and B (S130A and S130B). Usually, this translation (encoding) process is performed by the main-code lookup table 122 that maps the input source data signal SD and a current-state value S124 stored in the state register 124 to a main-code word S122 and a next-state value S125.

In the case of a substitution-code system, a regular substitution-code lookup table 123 used for periodically controlling the DC component of an encoded signal is provided. The regular substitution-code lookup table 123 maps the input source data signal SD and the current-state value S124 to two possible output-code selection signals S123A and S123B, and a next-state value S126. Each of regular substitution codes in the regular substitution-code lookup table 123 is a substitution code that can be periodically used at a predetermined frequency during the encoding process. This substitution code can be used for encoding an 8-bit source word into a 17-bit code word.

Further, each of stochastic substitution codes in the stochastic-substitution lookup table 129 is a substitution code that can be used only for a position in the encoded bit stream. A predetermined bit pattern is generated at this position.

The counter 127 determines a schedule for determining whether the result of the main-code lookup table 122 or the result of the regular substitution-code lookup table 123 should be used. The results of these tables are used for encoding according to this schedule.

The state register 124 uses the counter-state signal S127 for determining whether or not the contents thereof should be updated, for the next word translation, to the signal S122 from the main-code lookup table 122, the next state value S125 or the next state value S126 from the regular substitution-code lookup table 123.

The logic determination circuit 128 determines which output-code method is suitable or possible, based on the counter-state signal S127.

Where the regular substitution-code lookup table 123 is used, the substitution code words S123A and S123B pass the logic determination circuit 128, as output-code selection results S130A and S130B. Where the main-code lookup table 122 is used, the logic determination circuit 128 checks a current code word and the state information S122 by using the stochastic substitution lookup table 129 to see whether or not an arbitrary stochastic substitution code can be applied. If the stochastic substitution code can be applied, a stochastic substitution pattern signal S129 returns from the stochastic substitution lookup table 129 to the logic determination circuit 128. A substituted version of the main substitution code word S122 passes through the stochastic substitution lookup table 129, as the output-code selection result S130B, with an original non-substituted codeword S122 that passed as the output-code selection result S130A. If the stochastic substitution code cannot be applied, the original non-substitution main code word (the input-source data signal SD) passes as the output-system selection results S130A and S130B. If an arbitrary substitution code can be used, the logic determination circuit 128 sets a node flag signal S120 indicating that a plurality of encoding methods can be used for a current data word to be encoded.

An output code word generated by the FSM encoder 102 has to satisfy minimum and maximum-run length constraints, and a restriction required for the mastering of the optical disk 7. Since these constraints and restriction are not relevant to the present invention, the content and precise design procedure of the lookup tables will not be described. The details of an algorithm relating to the design of FSM encoding process performed for generating such a run-length constraint code are disclosed in the above-described references.

Look-ahead Buffer

FIG. 14 illustrates the circuit configuration of the look-ahead buffer 103, where the value of the memory-depth (length) M is two. The look-ahead buffer 103 includes a pair of registers 131 and 132 in parallel and a switching circuit 133. Two possible selection values of a current data segment to be encoded are stored in a second pair of registers 132A and 132B, and two versions of a next data segment to be encoded are stored in a first pair of registers 131A and 131B.

The first pair of registers 131A and 131B and the second pair of registers 132A and 132B should be long enough to store a data segment as long as can be, according to the given encoding algorithm.

The code selection values S130A and S130B from the FSM encoder 102 are input to the first pair of registers 131A and 131B. The look-ahead DC controller 104 can use the contents of the first pair of registers 131A and 131B and those of the second pair of registers 132A and 132B, as next signals S131A and S131B to be encoded and current signals S132A and S132B to be encoded.

Two possible current data segments to be encoded are transmitted to the switching circuit 133. The switching circuit 133 selects one of the signals, as a final code sequence S133, based on a determination signal S134 output from the main encoder 105.

After a data segment is output from the registers 132A and 132B, the contents of the registers 131A and 131B are transmitted to the registers 132A and 132B, and new data sequences are loaded into the registers 131A and 131B. The node-flag signals 120 output from the logic determination circuit 128 are used for indicating the end of each input data segment.

Look-ahead DC Controller

The look-ahead DC controller 104 shown in FIG. 15 performs a complete search for every conceivable combination of sequences including M data segments stored in the look-ahead buffer 103. The look-ahead DC controller 104 determines a most suitable substitution code used for the current data segment to be encoded, by scoring all possible encoded results. The look-ahead DC controller 104 is different from the above-described look-ahead circuits in that it allows for variable data-segment lengths, where the length of the data segment is determined by the regular substitution-code lookup table 123 and the stochastic substitution lookup table 129. That is to say, the look-ahead CD controller 104 is adaptive.

The look-ahead DC controller 104 includes a parallel-encoder array circuit 142 having parallel encoders 142n (n=1 to 4), and a minimum-value detector 144.

Each search is initialized by synchronizing a value provided by the main encoder 105 with the state of registers of the parallel-encoder array circuit 142 by using a signal R101. After the initialization, the parallel-encoder array circuit 142 performs the search. The parallel encoders 142n perform encoding for all possible sequences of the data segments. For example, the parallel encoder 142, for a look-ahead path "00" performs analyses on a sequence corresponding to the data segments S132A and S131A, the parallel encoder 1422 corresponding to a look-ahead path "01" performs analyses on a sequence corresponding to the data segments S132A and S131B, and so forth.

Each of the parallel encoders 142n calculates the cumulative digital sum variance (deviation, distribution, square deviation, or square distribution) over the length of the look-ahead path and outputs the calculation result to the minimum-value detector 144.

The minimum-value detector 144 detects a predetermined value that can be used as a reference value among from the digital sums calculated by the parallel encoders 142n. Further, the minimum detector 144 outputs a detection signal S103. This detection signal S103 indicates whether the look-ahead path is the signal S132A or the signal S132B, where the look-ahead path has a minimum data-sum variance used for the current data segment to be encoded.

Main Encoder

Figure 16:
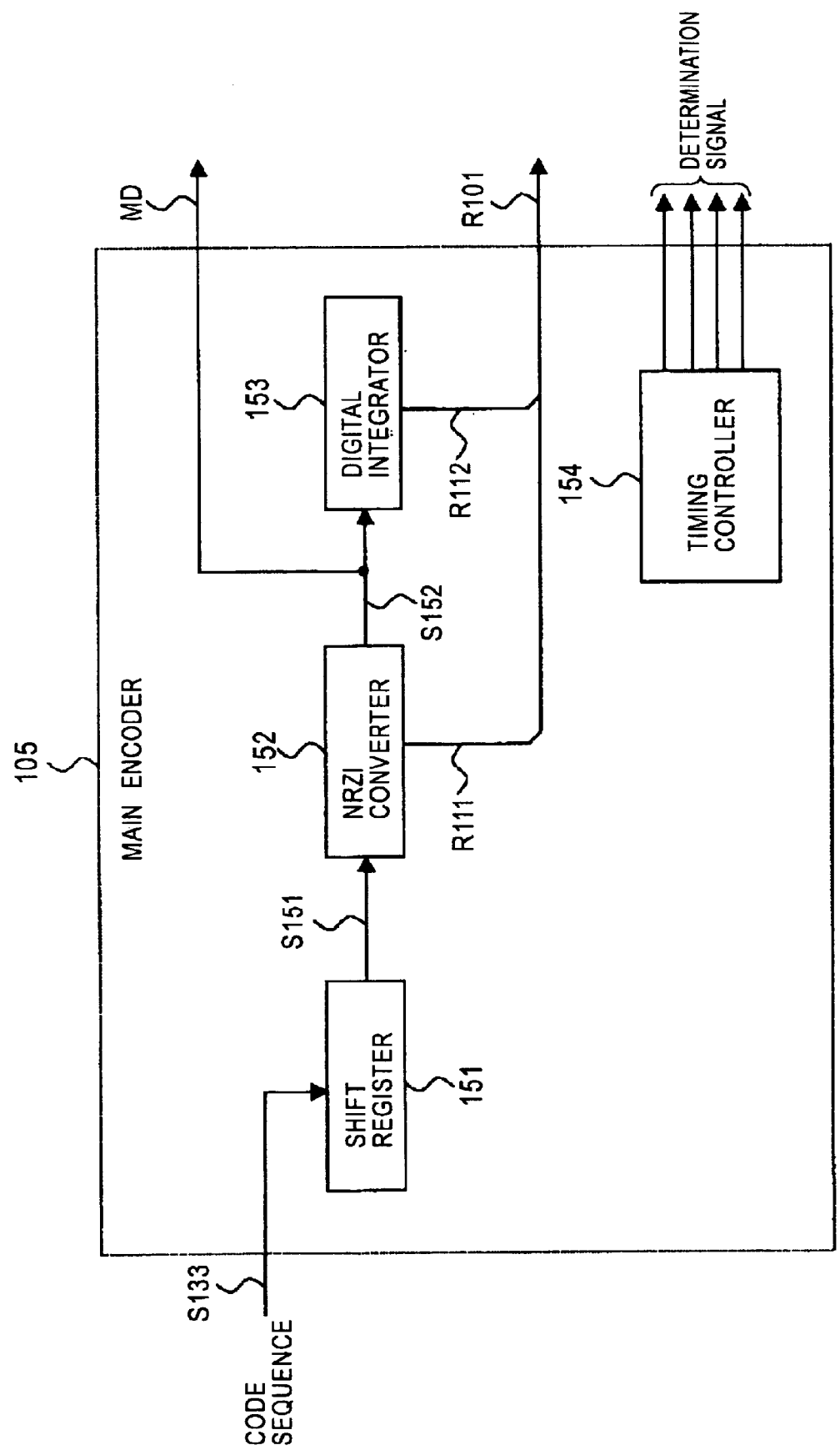
FIG. 16 is a circuit diagram of a main encoder shown in FIG. 12.

Once the look-ahead path is determined by the look-ahead DC controller, the main encoder 105 shown in FIG. 16 encodes an input most suitable current data segment into an output code sequence S133.

The main encoder 105 includes a shift register 151, an NRZI converter 152, and a digital integrator 153.

A digital segment input to the main encoder 105 is stored in the shift register 151. The shift register 151 outputs the contents of the input digital segment, as a sequence of NRZI words S151, to the NRZI converter 152.

The NRZI converter 152 translates the output sequence into a final NRZI encoded modulation bit-sequence signal S152, as an output modulation data signal MD for mastering an optical-disk recording medium.

The digital integrator 153 integrates the final NRZI encoded modulation bit-sequence signal S152 and calculates a final RDS value R112 at the end of encoding procedures performed for the current data segment to be encoded. This final RDS value R112 and a final NRZI state signal R111 of the NRZI converter 152 are grouped into a common-state signal R101 and transmitted to the look-ahead DC controller 104.

Parallel Encoder 142n

Figure 17:
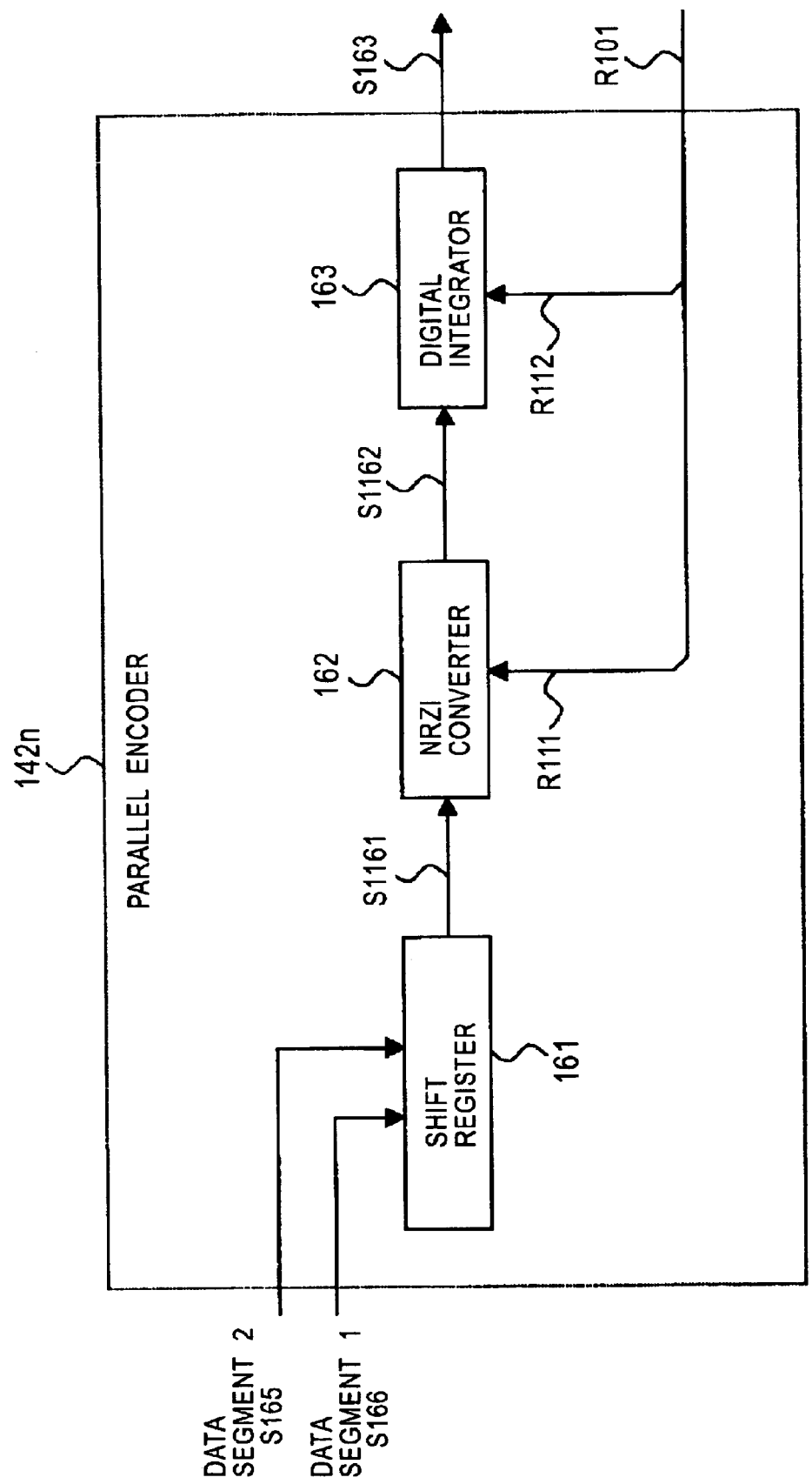
FIG. 17 is a circuit diagram of a parallel encoder shown in FIG. 15.

FIG. 17 illustrates the configuration of one of the parallel encoders 142n of the parallel-encoder array circuit 142 used in the look-ahead DC controller 104. The configuration of each of the parallel encoders 142n is similar to that of the main encoder 105. The parallel encoder 142n includes a shift register 161, an NRZI converter 162, and a digital integrator 163.

The shift register 161 holds a data-segment sequences S165 and S166 to be analyzed.

The NRZI converter 162 translates the data segment sequences S165 and S166 held in the shift register 161 into a serial bit stream S162. Unlike the main encoder 105, the parallel encoder 142n does not need the modulated data signal as an output. Instead, the digital integrator 163 calculates and transmits a running digital sum variance (RDSV) S163 as an output. The parallel encoder 142n receives the NRZI state signal R111 and the RDS value R112 from the main encoder 105 for initialization. These signals R111 and R112 synchronize the final state of the main encoder 105 with the initial state of the look-ahead calculation at the starting point of each encoding cycle.

The finite state machine (FSM) encoder designed according to the methods disclosed in the above-described references typically generates NRZI code sequences. For forming a modulation bit sequence, the code of the sequences must be converted into an NRZI bit sequence by the NRZI converters 152 and 162 shown in FIG. 18.

NRZI Converter

Figure 18:
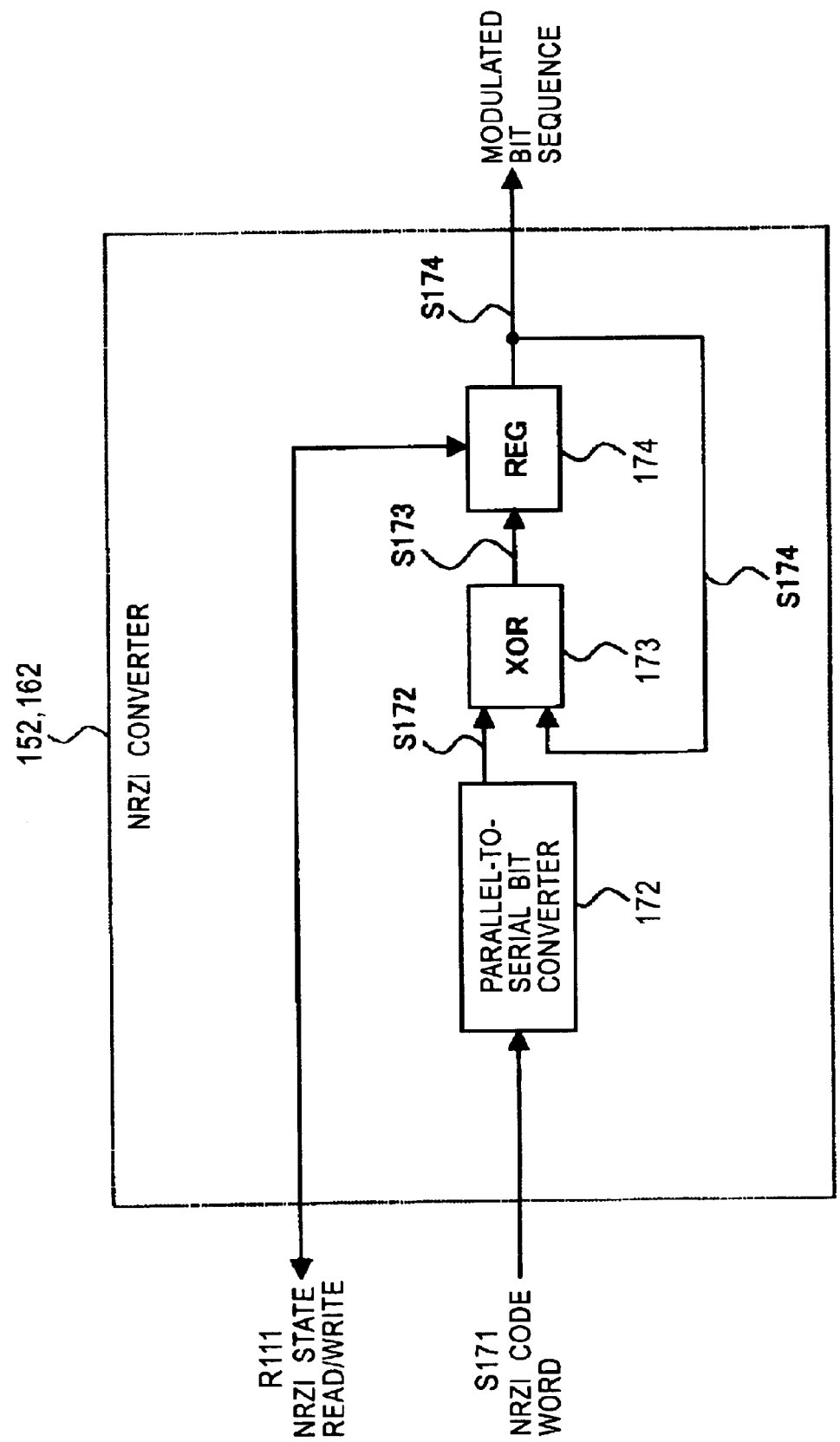
FIG. 18 is a circuit diagram of an NRZI converter shown in FIG. 16.

As shown in FIG. 18, the circuit configuration of the NRZI converter 152 is the same as that of the NRZI converter 162. Each of these converters has a parallel/serial converter 172 for converting a parallel bit sequence into a serial bit sequence, an XOR gate 173, and a register 174.

The NRZI converters 152/162 receives and translates NRZI code words S171 into a corresponding to NRZI modulation bit sequence S174. Therefore, the parallel-to-serial converter 172 first converts the code words into a serial bit sequence.

The XOR gate 173 calculates the XOR of the converted bit sequence S172 and a feedback signal S174 held in the register 174 and outputs the calculation result to the register 174.

The NRZI-state signal R111 allows for making the state of the parallel-to-serial converter 172 readable and writable for synchronizing the NRZI converter 162 of each of the parallel encoders 142$n$ in the look-ahead DC controller 104 with the NRZI converter 152 of the main encoder 105.

The NRZI converter 152/162 is followed by the digital integrator 153/163 for calculating both an RDS and a running digital sum variance (RDSV) value over the modulation bit sequence.

Data Integrator

Figure 19:
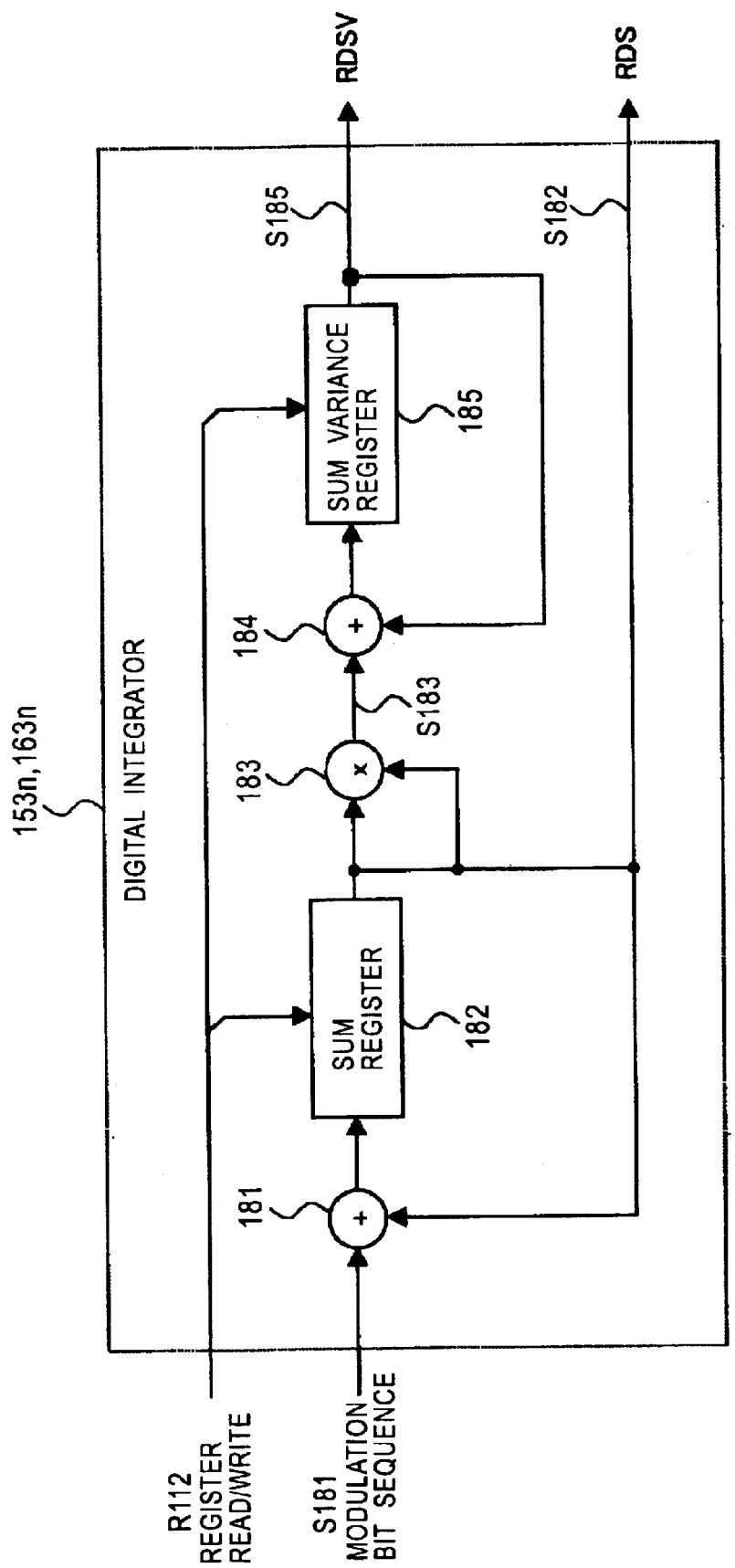
FIG. 19 is a circuit diagram of a digital integrator shown in FIG. 16.

FIG. 19 illustrates the circuit configuration of the digital integrator 153$n$/163$n$. That is to say, the circuit configuration of the digital integrator 153$n$ is the same as that of the digital integrator 163$n$. Each of these integrators includes a first integration loop (a first integration circuit) that has an adder 181 and a register 182 and that calculates an RDS. This first integration loop is followed by a multiplier 183 and a second integration loop (a second integration circuit) that has an adder 184 and a register 185 and that calculates an RVSV.

The first integration circuit operates as an up/down counter. Where the value of the modulation bit signal S181 is a binary "0", the content of the register 182 is decreased by one, and where the value of the modulation bit signal S181 is a binary "1", the content of the register 182 is increased by one. The multiplier 183 squares the calculation result of the first integration circuit, that is, the RDS.

The second integration circuit accumulates the result of the multiplier 183 in the register 185 and generates an RDSV value S185.

The read/write-state signal R112 allows for initializing the content of the digital integrator 153$n$ of the parallel encoder 142$n$ in the look-ahead DC controller 104.

Performance Assessments

Figure 20:
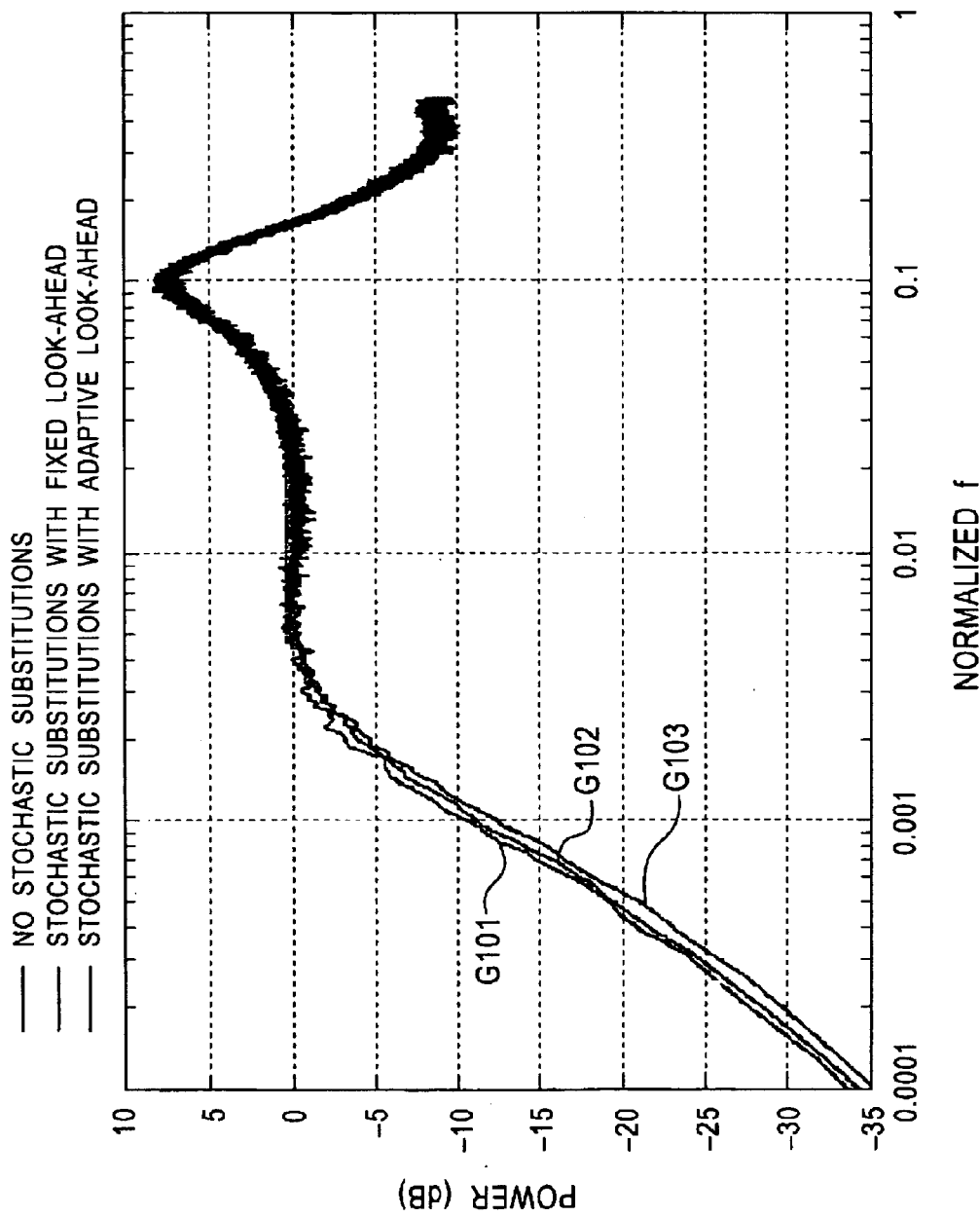
FIG. 20 is a graph illustrating the power density spectrum of a random-encoding sequence, where the performance of EFMCC encoding with adaptive look-ahead DC control is compared to the performance of EFMCC encoding without adaptive look-ahead DC control.

FIG. 20 is a graph illustrating the result of power-spectrum density measurement for making performance assessments of this embodiment. In this graph, an abscissa indicates a frequency normalized with respect to the clock frequency of a modulation code and an ordinate indicates the measurement value of amplitude specified in decibel (dB).

For this measurement, a long code sequence is generated from random-number data, according to this embodiment. The power spectrum is measured from this code sequence by using Fourier-analysis techniques disclosed in, for example, the above-described reference, that is, Oppenheim, Schafer, "Discrete-Time Signal Processing", Prentice Hall, 1989.

A curve G101 indicates a power spectrum where EFMCC encoding is performed without performing adaptive look-ahead control and using a stochastic substitution code. This power spectrum shows a result where look-ahead of 8 segments is applied, based only on periodical use of the regular substitution-code lookup table 123.

A curve G102 indicates a power spectrum as a result of applying modified EFMCC encoding. Although a stochastic substitution code is used, it is not used as a determination point of the look-ahead system. This power spectrum shows a result where the look-ahead of 8 segments is applied, based only on periodical use of the regular substitution-code lookup table 123.

A curve G103 indicates a power spectrum as a result of this embodiment. In this look-ahead system, the stochastic substitution code is used and look-ahead of adaptive 8 segments with a variable length is used. As a result, the adaptive look-ahead encoding of this embodiment achieves DC-component suppression better than in the case of both the above-described encoding methods.

This curve G103 shown in FIG. 20 indicates that this embodiment achieves the improved DC-component suppression.

For recording onto the optical-disk recording medium, this invention uses both the regular substitution-code lookup table and the stochastic substitution lookup table so as to improve the performance of encoding, such as the EFMCC encoding. Further, the present invention achieves an encoding efficiency higher than in the case of EFM$^+$ encoding used for DVDs, while maintaining the quality of DC-component suppression.

Although this embodiment has been described by referring to the EFMCC encoding method performed by using a stochastic substitution code and the optical-disk mastering, the present invention is not limited to the above-described embodiments, but can be achieved in various forms.

Various encoding methods achieved by the present invention use a method similar to the EFMCC encoding method, by providing selection means for encoding a data word. Accordingly, improved DC-component suppression can be achieved. The utilization of the present invention is not limited to mastering of an optical-disk recording medium. For example, the present invention can be used for a hard-disk recording medium or a magnetic-table recording medium using a run-length limitation code, even though design parameter of the code construction thereof is different from that of the optical-disk recording medium.

The present invention is not limited to the above-described embodiments but can be achieved in various modified forms. For example, the parallel implementation in the parallel-encoder array circuit 142 of the look-ahead DC controller 104 can be replaced by serial implementation to trade off hardware cost for calculation time.

Accordingly, the scope of the present invention should be determined not by the above-described embodiments that have been described with reference to the attached drawings, but by the appended claims and their legal equivalents.

What is claimed is:

1. A method for encoding binary data, the method including the steps of:
    performing encoder mapping for converting at least one data word having N data bit(s) into at least one binary modulation word having M data bit(s), wherein redundant information is provided so that a predetermined data word can be translated into a plurality of modulation words; and selecting a predetermined modulation word from among the plurality of modulation words obtained through the encoder mapping step, according to a look-ahead determination criterion method, wherein the look-ahead determination criterion method includes the steps of:

recording a current data word to be modulated and a predetermined number of future data words in either an original form or in a pre-encoded form;

making a path search for evaluating a running digital sum (RDS) for a combinational tree whose space is expanded by a multiplier of the modulation words generated by performing the encoder mapping for the recorded current and future data words; and making a determination to select an encoding mapping method suitable for the current data word to be encoded by determining a path nearest to bounds of the RDS of the path search, wherein a low-frequency component of a resulting binary modulation sequence is suppressed so that the value of a first-order spectrum becomes null at a frequency of 0 Hz.

2. A method for encoding binary data according to claim 1, wherein the step of making the determination includes the step of selecting an encoder mapping method suitable for the current data word to be encoded by determining a path that is nearest to the bounds of the RDS and that is nearest to the bounds of a running sum of the RDS, and wherein the value of a second-order spectrum becomes null at the frequency of 0 Hz.

3. An encoding apparatus for encoding binary data, the encoder comprising:

an encoder mapping device for converting at least one data word having N data bit(s) into at least one binary modulation word having M data bit(s) and providing redundant information so as to translate a predetermined data word into a plurality of modulation words;

a look-ahead determination criterion generator; and a selector for selecting a predetermined modulation word from among the plurality of modulation words obtained through the encoder mapping device according to a criterion generated by the look-ahead determination criterion generator, wherein the look-ahead determination criterion generator includes:

a memory for recording a current data word to be modulated and a predetermined number of future data words in either an original form or in a pre-encoded form;

a path searcher for evaluating a running digital sum (RDS) for a combinational tree whose space is expanded by the plurality of modulation words generated through the encoder mapping performed for the recorded current data word and future data words; and a determination device for selecting an encoding mapping method suitable for the current data word to be encoded by determining a path nearest to bounds of the RDS of the path search;

wherein a low-frequency component of a resulting binary modulation sequence is suppressed so that the value of a first-order spectrum becomes null at a frequency of 0 Hz.

4. An encoding device for encoding binary data according to claim 3, wherein the determination device selects an encoder mapping method suitable for the current data word to be encoded by determining a path that is nearest to the bounds of the RDS and that is nearest to the bounds of a running sum of the RDS, and wherein a low-frequency component of a resulting binary modulation sequence is suppressed so that the value of a second-order spectrum becomes null at the frequency of 0 Hz.

5. An optical-disk recording method for recording an information signal onto an optical-disk recording medium by performing on/off modulation for continual laser light in a predetermined cycle based on a resulting encoded signal obtained through a predetermined encoding method, wherein the encoding method includes the steps of:

performing encoder mapping for converting at least one data word having N data bit(s) into at least one binary modulation word having M data bit(s), wherein redundant information is provided so that a predetermined data word can be translated into a plurality of modulation words; and selecting a predetermined modulation word from among the plurality of modulation words obtained through the encoder mapping step, according to a look-ahead determination criterion method, wherein the look-ahead determination criterion method includes the steps of:

recording a current data word to be modulated and a predetermined number of future data words in either an original form or in a pre-encoded form;

making a path search for evaluating a running digital sum (RDS) for a combinational tree whose space is expanded by the plurality of the modulation words generated by performing the encoder mapping for the recorded current and future data words; and making a determination to select an encoding mapping method suitable for the current data word to be encoded by determining a path nearest to bounds of the RDS of the path search, wherein the step of making the determination includes the step of selecting an encoder mapping method suitable for the current data word to be encoded by determining a path that is nearest to the bounds of the RDS and that is nearest to the bounds of a running sum of the RDS, and wherein a low-frequency component of a resulting binary modulation sequence is suppressed so that the value of a second-order spectrum becomes null at the frequency of 0 Hz.

6. An optical-disk recording apparatus comprising:

a laser-light source for emitting continual laser light;

a modulator for modulating the continual laser light from the laser-light source and irradiating an optical-disk recording medium with the modulated laser light; and an encoding device for encoding an information signal to be recorded onto the optical-disk recording medium into an on-off modulation signal and outputting the encoded on-off modulation signal to the modulator, wherein the encoding device includes:

an encoder mapping device for converting at least one data word having N data bit(s) into at least one binary modulation word having M data bit(s) and providing redundant information so as to translate a predetermined data word into a plurality of modulation words;

a look-ahead determination criterion generator; and a selector for selecting a predetermined modulation word from among the plurality of modulation words obtained through the encoder mapping device according to a criterion generated by the look-ahead determination criterion generator, wherein the look-ahead determination criterion generator includes:

a memory for recording a current data word to be modulated and a predetermined number of future data words in either an original form or in a pre-encoded form;

a path searcher for evaluating a running digital sum (RDS) for a combinational tree whose space is expanded by the plurality of modulation words generated through the encoder mapping performed for the recorded current data word and future data words; and a determination device for determining an encoding mapping method suitable for the current data word to be encoded by selecting a path nearest to bounds of the RDS of the path search, wherein the determination device has a selector for selecting an encoder mapping method suitable for the current data word to be encoded by determining a path that is nearest to bounds of the RDS and that is nearest to bounds of a running sum of the RDS, and wherein a low-frequency component of a resulting binary modulation sequence is suppressed so that the value of a second-order spectrum becomes null at a frequency of 0 Hz.

7. A method for encoding binary data, the method including the steps of:

performing encoder mapping for converting at least one data word having N data bit(s) into at least one binary modulation word having M data bit(s), wherein redundant information is provided so that a predetermined data word can be translated into a plurality of modulation words by using a regular substitution code and a stochastic substitution code;

detecting a position of a word for which the regular substitution code and the stochastic substitution code are used; and selecting a predetermined modulation word from among the plurality of modulation words obtained through the encoder mapping step, according to a look-ahead determination criterion method, wherein the selection step includes:

storing a current data segment to be encoded with a variable length and a future data segment with a variable length in either an original form or in a pre-encoded form;

evaluating a determination criterion for each path search in a combinational tree whose space is expanded by the plurality of modulation words, the modulation words being generated by performing the encoder mapping for the current data segment and the future data segment that are stored in the memory; and making a determination to select an encoding mapping method suitable for the current data segment to be encoded by determining a path with a best value of the determination criterion for the path search, wherein a low-frequency component of a resulting binary modulation sequence is suppressed.

8. A method for encoding binary data according to claim 7, wherein the determination criterion includes a variance of a running digital sum (RDS).

9. A method for encoding binary data according to claim 7, wherein the regular substitution code includes a substitution code that can be periodically used at a predetermined frequency during the encoding.

10. A method for encoding binary data according to claim 9, wherein the regular substitution code is used for encoding an 8-bit source word into a 17-bit code word.

11. A method for encoding binary data according to claim 7, wherein the stochastic substitution code is used only in a predetermined position where a predetermined bit pattern occurs in an encoded bit stream.

12. An encoding apparatus for encoding binary data, the encoding apparatus comprising:

an encoder that converts at least one data word having N data bit(s) into at least one binary modulation word having M data bit(s) and that provides redundant information for translating a predetermined data word into a plurality of modulation words by using a regular substitution code and a stochastic substitution code;

a detector for detecting a position of a word for which the regular substitution code and the stochastic substitution code are used; and a selector for selecting a predetermined modulation word from among the plurality of modulation words, which is obtained by the encoder, according to a look-ahead determination criterion, wherein the selector includes:

a memory for storing a current data word to be encoded with a variable length and a future data segment with a variable length in either an original form or in a pre-encoded form;

an evaluation device for evaluating a determination criterion for each path search in a combinational tree whose space is expanded by the plurality of modulation words, the modulation words being generated by performing the encoder mapping for the current data segment and the future data segment that are stored in the memory; and a determination apparatus for making a determination to select an encoding mapping method suitable for the current data segment to be encoded by determining a path with a best value of the determination criterion for the path search, wherein a low-frequency component of a resulting binary modulation sequence is suppressed.

13. An encoding apparatus according to claim 12, wherein the determination criterion includes a variance of a running digital sum (RDS).

14. An encoding apparatus according to claim 12, wherein the regular substitution code includes a substitution code that can be periodically used at a predetermined frequency during the encoding.

15. An encoding apparatus according to claim 14, wherein the regular substitution code is used for encoding an 8-bit source word into a 17-bit code word.

16. An encoding apparatus according to claim 12, wherein the stochastic substitution code is used only in a predetermined position where a predetermined bit pattern occurs in an encoded bit stream.

17. An optical-disk recording apparatus comprising:

a laser-light source for emitting continual laser light;

a modulator for modulating the continual laser light from the laser-light source and irradiating an optical-disk recording medium with the modulated laser light; and an encoding device for encoding an information signal to be recorded onto the optical-disk recording medium into an on-off modulation signal and outputting the encoded on-off modulation signal to the modulator, wherein the encoding device includes:

an encoder for converting at least one data word having N data bit(s) into at least one binary modulation word having M data bit(s) and providing redundant information so as to translate a predetermined data word into a plurality of modulation words by using a regular substitution code and a stochastic substitution code;

a detector for detecting a position of a word for which the regular substitution code and the stochastic substitution code are used; and a selector for selecting a predetermined modulation word from among the plurality of modulation words, which is obtained by the encoder, according to a look-ahead determination criterion, wherein the selector includes:

a memory for storing a current data segment to be encoded with a variable length and a future data segment with a variable length in either an original form or in a pre-encoded form;

an evaluation device for evaluating a determination criterion for each path search in a combinational tree whose space is expanded by the plurality of modulation words, the modulation words being generated by performing the encoder mapping for the current data segment and the future data segment that are stored in the memory; and a determination apparatus for making a determination to select an encoding mapping method suitable for the current data segment to be encoded by determining a path with a best value of the determination criterion for the path search, wherein a low-frequency component of a resulting binary modulation sequence is suppressed.

18. An optical-disk recording apparatus according to claim 17, wherein the determination criterion includes a variance of a running digital sum (RDS).

19. An optical-disk recording apparatus according to claim 17, wherein the regular substitution code includes a substitution code that can be periodically used at a predetermined frequency during the encoding.

20. An optical-disk recording apparatus according to claim 19, wherein the regular substitution code is used for encoding an 8-bit source word into a 17-bit code word.

21. An optical-disk recording apparatus according to claim 17, wherein the stochastic substitution code is used only in a predetermined position where a predetermined bit pattern occurs in an encoded bit stream.

* * * * *